US00RE43359E

(19) United States
(12) Reissued Patent
Avramescu et al.

(10) Patent Number: US RE43,359 E
(45) Date of Reissued Patent: May 8, 2012

(54) SYSTEM AND METHOD FOR LOW POWER SEARCHING IN CONTENT ADDRESSABLE MEMORIES USING SAMPLING SEARCH WORDS TO SAVE POWER IN COMPARE LINES

(75) Inventors: Radu Avramescu, Nepean (CA); Jason Edward Podaima, Kanata (CA)

(73) Assignee: Core Networks LLC, Las Vegas, NV (US)

(21) Appl. No.: 11/503,542

(22) Filed: Aug. 10, 2006

Related U.S. Patent Documents

Reissue of:
(64) Patent No.: 6,775,167
Issued: Aug. 10, 2004
Appl. No.: 10/386,580
Filed: Mar. 11, 2003

U.S. Applications:
(63) Continuation-in-part of application No. 09/943,653, filed on Aug. 30, 2001, now Pat. No. 6,577,519.

(51) Int. Cl.
*G11C 15/00* (2006.01)
(52) U.S. Cl. ..... 365/49; 365/189.07
(58) Field of Classification Search ..... 365/49, 365/189.07
See application file for complete search history.

(56) References Cited

U.S. PATENT DOCUMENTS

| | | | | |
|---|---|---|---|---|
| 6,169,685 | B1 | 1/2001 | Gandini et al. | |
| 6,252,790 | B1 | 6/2001 | Shectman | |
| 6,288,922 | B1 | 9/2001 | Wong et al. | |
| 6,392,910 | B1 | 5/2002 | Podaima et al. | |
| 6,526,474 | B1 | 2/2003 | Ross | |
| 6,553,453 | B1 | 4/2003 | Gibson et al. | |
| 6,577,519 | B1 | 6/2003 | Avramescu | |
| 6,775,167 | B1 | 8/2004 | Avramescu et al. | |
| 7,002,823 | B1 * | 2/2006 | Ichiriu | 365/49.17 |
| 7,257,763 | B1 * | 8/2007 | Srinivasan et al. | 714/764 |

* cited by examiner

*Primary Examiner* — Tuan T. Nguyen

(57) ABSTRACT

[An invention is provided for low] *Low* power searching in a CAM [using] *uses* sample words to save power in the compare lines. [The invention] *A method* includes comparing a sample section of stored data to a corresponding sample section of search data on a plurality of rows in the CAM. If a sample section of the stored data on any row of the plurality of rows is equivalent to the corresponding sample section of the search data, a remaining section of search data is allowed to propagate to the local compare lines coupled to the remaining section of the stored data of each row. However, if the sample section of the stored data is different from the corresponding sample section of the search data, the local compare lines coupled to the remaining section of the stored data on each row are latched.

31 Claims, 28 Drawing Sheets

SYSTEM AND METHOD FOR LOW POWER SEARCHING IN CONTENT ADDRESSABLE MEMORIES USING SAMPLING SEARCH WORDS TO SAVE POWER IN COMPARE LINES

Matter enclosed in heavy brackets [ ] appears in the original patent but forms no part of this reissue specification; matter printed in italics indicates the additions made by reissue.

CROSS REFERENCE TO RELATED APPLICATIONS

This application is a continuation-in-part of U.S. patent application Ser. No. 09/943,653, filed Aug. 30, 2001, now U.S. Pat. No. 6,577,519 and entitled "System and Method for Low Power Search in Content Addressable Memories Using Sample Search Words," which is incorporated herein by reference; this application is related to: 1) U.S. patent application Ser. No. 09/944,251, filed Aug. 30, 2001, and entitled "System and Method for Low Power Search in Content Addressable Memories Using Non-Precharged Compare lines," and 2) U.S. patent application Ser. No. 09/944,256, filed Aug. 30, 2001, and entitled "System and Method for Low Power Search in Content Addressable Memories Using Non-Precharged Match lines," each of which is incorporated herein be reference.

BACKGROUND OF THE INVENTION

1. Field of the Invention

This invention relates generally to memory circuits, and more specifically to low power search techniques in content addressable memory circuits using sample words to save power in compare lines.

2. Description of the Related Art

A content addressable memory (CAM) semiconductor device is a device that allows the entire contents of the memory to be searched and matched instead of having to specify one or more particular memory locations in order to retrieve data from the memory. Thus, a CAM may be used to accelerate any application requiring fast searches of a database, list, or pattern, such as in database machines, image or voice recognition, or computer and communication networks.

CAMs provide performance advantages over conventional memory devices having conventional memory search algorithms, such as binary or tree-based searches, by comparing the desired search term, or comparand, against the entire list of entries simultaneously, giving an order-of-magnitude reduction in the search time. For example, a binary search through a non-CAM based database of 1000 entries may take ten separate search operations whereas a CAM device with 1000 entries may be searched in a single operation, resulting in significant time and processing savings. Internet routers often include a CAM for searching the address of specified data, allowing the routers to perform fast address searches to facilitate more efficient communication between computer systems over computer networks.

Conventional CAMs typically include a two-dimensional row and column content addressable memory core array of cells. In such an array, each row typically contains an address, pointer, or bit pattern entry. In this configuration, a CAM may perform "read" and "write" operations at specific addresses as is done in conventional random access memories (RAMs).

However, unlike RAMs, data "search" operations that simultaneously compare a bit pattern of data against an entire list (i.e., column) of pre-stored entries (i.e., rows) can be performed.

FIG. 1A shows a simplified block diagram of a conventional CAM 100. The CAM 100 includes a data bus 102 for communicating data, an instruction bus 104 for transmitting instructions associated with an operation to be performed, and an output bus 106 for outputting a result of the operation. For example, in a search operation, the CAM 100 may output a result in the form of an address, pointer, or bit pattern corresponding to an entry that matches the input data.

As mentioned above, to perform a search operation a CAM includes a plurality of bit pattern entries, each comprising a series of CAM cells coupled to a local match line. FIG. 1B is a schematic diagram showing a prior art bit pattern entry 120 in a conventional CAM. The bit pattern entry 120 includes a plurality of CAM cells 122 coupled to a local match line 124. In addition, the bit pattern entry 120 includes a current generator 126 and precharge circuitry 128 coupled to the local match line 124. The local match line 124 is further coupled to an inverter 130, which is coupled to an inverter latch 132. Each CAM cell 122 is also coupled to a pair of compare lines K0 and K1. Although, for clarity, only one CAM cell 122 is shown coupled to compare lines in FIG. 1B, it should be noted that all the CAM cells 122 are actually coupled to compare lines.

During a search operation, the precharge circuitry 128 precharges the match line 124 to a predictable state, which is generally low, to prepare for the search. The compare data, known as the comparand, is then compared to the bit pattern entry 120. Specifically, compare lines, such as compare lines K0 and K1, are used to compare the comparand to the data stored in the CAM cells 122. The current generator 126 begins to supply current to the match line 124. As the compare data is compared to the data stored in each CAM cell 122, the CAM cell will ground the match line 124 if the data stored in the CAM cell 122 does not match the compare data. Thus, if any CAM cell 122 does not match the compare data, the match line 124 will be pulled low. Conversely, if all the CAM cells 122 in the bit pattern entry 120 match the comparand, the match line 124 will remain high. The signal from the match line 124 is then sent through an inverter 130, and then to the inverter latch 132, which provides a high or low output, as described in greater detail below.

FIG. 1C is a diagram showing exemplary search signals 150 for a conventional CAM. The search signals 150 include an external clock 152, a first compare line K0 154, a second compare line K1 156, an internal clock 158, a match line 160, and a search output 162. As previously mentioned, during a search the compare lines 154 and 156 are used to provide search data to a particular CAM cell. Each compare line 154 and 156 will be set to either high or low, depending on the search data. Typically the compare lines K0 154 and K1 156 are set to the inverse of each other, however, when using a ternary CAM cell both compare lines 154 and 156 may be set to the same value. In the example of FIG. 1C, a first set of search data is placed on the compare lines for the first and second external clock cycle 150a and 150b. Then the search data is inverted in the third and fourth external clock cycle 150c and 150d. In addition, the data stored in the CAM cell matches the first set of search data, during the first and second external clock cycle 150a and 150b, and does not match during the third and fourth external clock cycle 150c and 150d.

To set the compare lines 154 and 156 to their appropriate values in a conventional CAM, each compare line 154/156 is first set to a predictable state of zero, or low. Then, one of the compare lines is asserted high. As shown in FIG. 1C, at the rising edge of the first external clock cycle 150a, both compare lines 154 and 156 are set low. Shortly thereafter, one of the compare lines is asserted high, in this case compare line K0 154, thus in the first external clock cycle 150a, K0 154 is asserted high and K1 remains low.

Next, at the rising edge of the second external clock cycle 150b, compare line K0 154 is again set to a predictable state of zero. In this case, the search data for this particular CAM cell remains the same in the second external clock cycle 150b, thus compare line K0 154 is again asserted high shortly after the rising edge of the second external clock cycle 150b. In a similar manner, both compare lines K0 154 and K1 156 are set to a state of zero at the beginning of the third external clock cycle 150c. This time the comparand changes, thus switching compare lines K0 154 and K1 156 such that K1 156 is asserted high shortly after the rising edge of the third external clock cycle 150c, while K0 154 remains low. At the rising edge of the fourth clock cycle 150d, both compare lines 154 and 156 are set to zero. The search data remains the same for the fourth external clock cycle 150d, thus compare line K1 156 is again asserted high shortly after the rising edge of the fourth clock cycle 150d.

Thus, in a conventional CAM the compare lines are pulsed to compare the search data to the data stored in the CAM cell. This results in two transitions for every clock cycle of the external clock 152, regardless of the actual data being placed on the compare lines. As will be explained in greater detail subsequently, each transition requires increased power in the CAM to overcome the capacitance of the compare line.

Continuing with the above example, an internal clock 158 is used to control the search results in the conventional CAM. The internal clock 158 is an inverted clock, which is pulsed slightly after the compare lines 154 and 156 are set to the appropriate search value. As mentioned above, in the example of FIG. 1C the search data matches the data stored in the CAM cell during the first and second external clock cycle 150a and 150b, and does not match during the third and fourth external clock cycle 150c and 150d. Hence, at leading edge of the first internal clock cycle 158a, the match line 160 begins to ramp up, since the data stored in the CAM cell matches the comparand in the first external clock cycle 150a.

The rising match line 160 causes the inverted latch to output a high search output signal 162 during the first internal clock cycle. The precharge circuitry coupled to the match line 160 then causes the match line 160 to discharge and go low at the trailing edge of the first internal clock pulse 158a. As a result, during the leading edge of the second internal clock pulse 158b the output signal 162 is low. The output signal 162 then transitions to high after the match line 160 ramps to a sufficient level, later during the second internal clock pulse 158b. During the third and fourth external clock pulses 150c and 150d, the data stored in the CAM cell does not match the comparand. Hence, both the match line 160 and the output signal 162 are low during the third and fourth internal clock pulses 158c and 158d. Thus, during consecutive match results, the output signal 162 of the conventional CAM generally must transition from low to high during each internal clock cycle.

Each output 162 for each bit pattern entry of the CAM is coupled to a global match line, which is a long line that provides the search results to other areas of the CAM for further processing, such as to priority encoders. The long length of the global match lines results in each global match line having a large capacitance. As a result, every transition on a global match line requires a large amount of power to overcome the large capacitance. Since the output signals from the bit pattern entries propagate to the global match lines, every transition in the output signal results in a large power drain on the CAM. A similar result occurs with respect to the compare lines, each transition in the compare lines requires increased power from the CAM to overcome the capacitance of the compare line.

In view of the foregoing, there is a need for low power search methods for use in content addressable memory circuits. The methods should reduce the power required to perform searches in the CAM, and decrease the amount of transitions required during search operations.

SUMMARY OF THE INVENTION

Broadly speaking, embodiments of the present invention address these needs by utilize sample words to reduce power usage in compare lines. In one embodiment, a method for low power searching in a CAM is disclosed. The method includes comparing a sample section of stored data to a corresponding sample section of search data on a plurality of rows in the CAM. If a sample section of the stored data on any row of the plurality of rows is equivalent to the corresponding sample section of the search data, a remaining section of search data is allowed to propagate to the local compare lines coupled to the remaining section of the stored data of each row. However, if the sample section of the stored data on every row of the plurality of rows is different from the corresponding sample section of the search data, the local compare lines coupled to the remaining section of the stored data on each row are latched.

In an additional embodiment, a match line is disclosed for a CAM. In this embodiment, the match line is one of a plurality of match lines forming a group of match lines. Each match line includes a sample match line coupled to a first set of CAM cells, and a sub-match line coupled to a second set of CAM cells. Each CAM cell in the second set of CAM cells is coupled to local compare lines that are in electrical communication with global compare lines via a plurality of local compare line latches. Coupled to the local compare line latches is a compare line propagation control circuit. In operation, the compare line propagation control circuit latches the local compare lines if a sample section of search data corresponding to the first set of CAM cells is different from data stored in the first set of CAM cells for each sample match line in the group of match lines.

A CAM is disclosed in a further embodiment of the present invention. The CAM includes a group of match lines, wherein each match line includes a sample match line coupled to a first set of CAM cells, and a sub-match line coupled to a second set of CAM cells. Each CAM cell of the second set of CAM cells is coupled to a pair of local compare lines. Also included in the CAM is a plurality of global compare lines, each spanning the width of the CAM, and in electrical communication with a plurality of local compare lines via a plurality of local compare line latches. The CAM further includes a compare line propagation control circuit, which is coupled to the local compare line latches. As above, the compare line propagation control circuit latches the local compare lines if a sample section of search data corresponding to the first set of CAM cells is different from data stored in the first set of CAM cells for each sample match line in the group of match lines. However, if the sample section of search data corresponding to the first set of CAM cells is equivalent to data stored in the first set of CAM cells for any sample match line in the group of match lines, the compare line propagation control circuit allows the search data to propagate from the global compare lines to the local compare lines. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for low power search methods in content addressable memories. To this end, an invention is disclosed for low power searching in content addressable memories using sample search words to save power in compare lines. Embodiments of the present invention utilize the results of sample searches on multiple rows to gate the propagation of search data on the compare lines that correspond to the rest of the word. If a "miss" results from all the sample words in a group of sample words on multiple rows, the search data is not propagated to the corresponding compare lines for the remainder of the word on each row of the group, thus saving power on those compare lines. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1A:
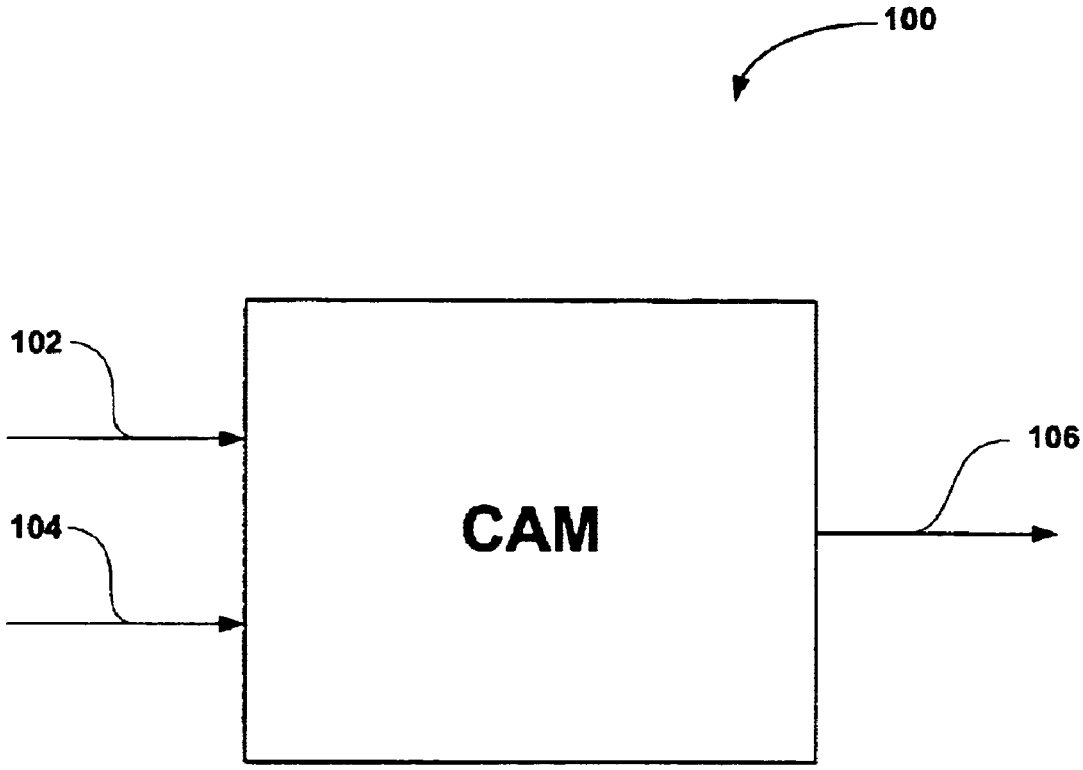
FIG. 1A (Prior Art)
FIG. 1A shows a simplified block diagram of a conventional CAM.
Figure 1B:
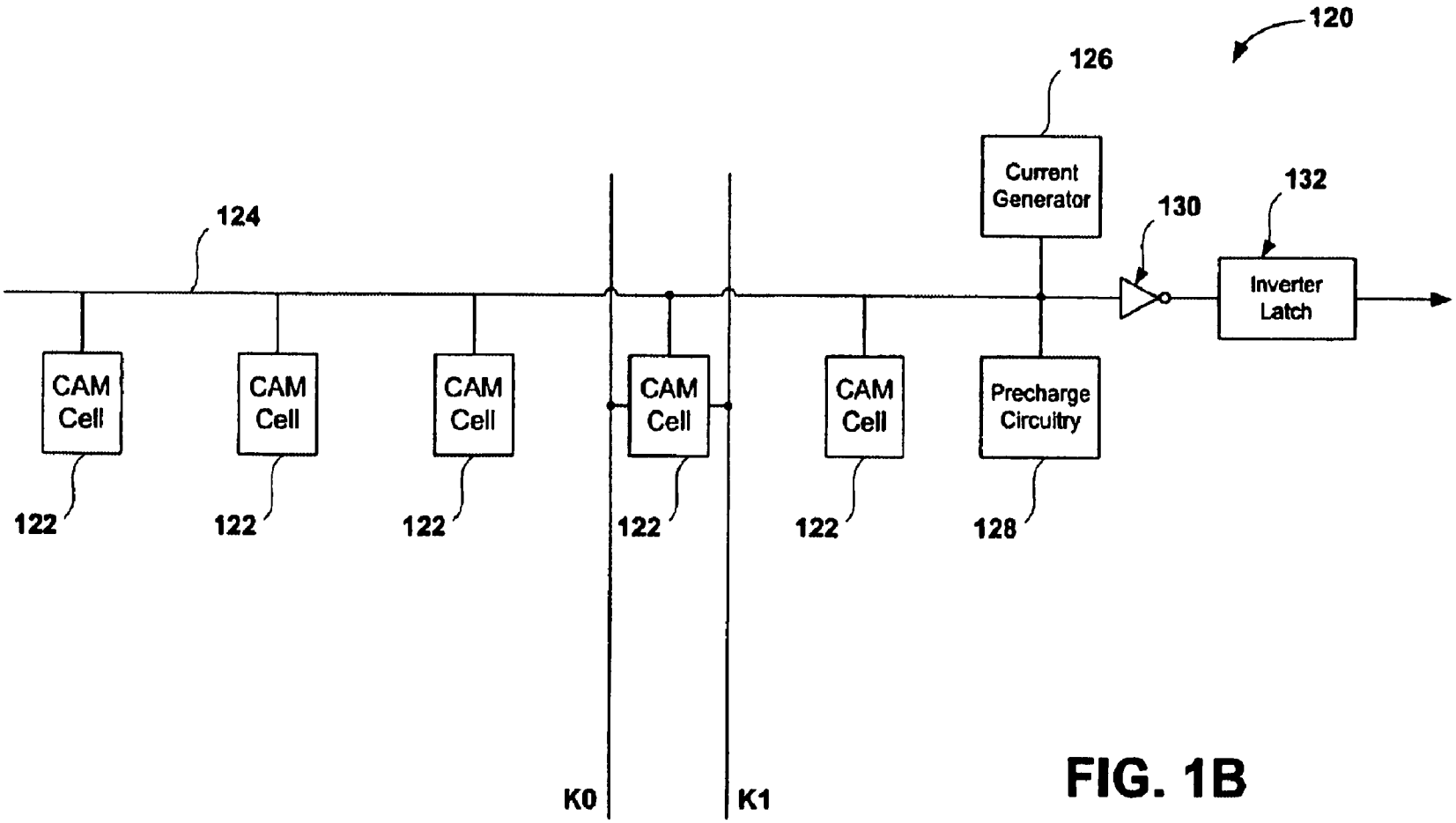
FIG. 1B is a schematic diagram showing a prior art bit pattern entry in a conventional CAM.
Figure 1C:
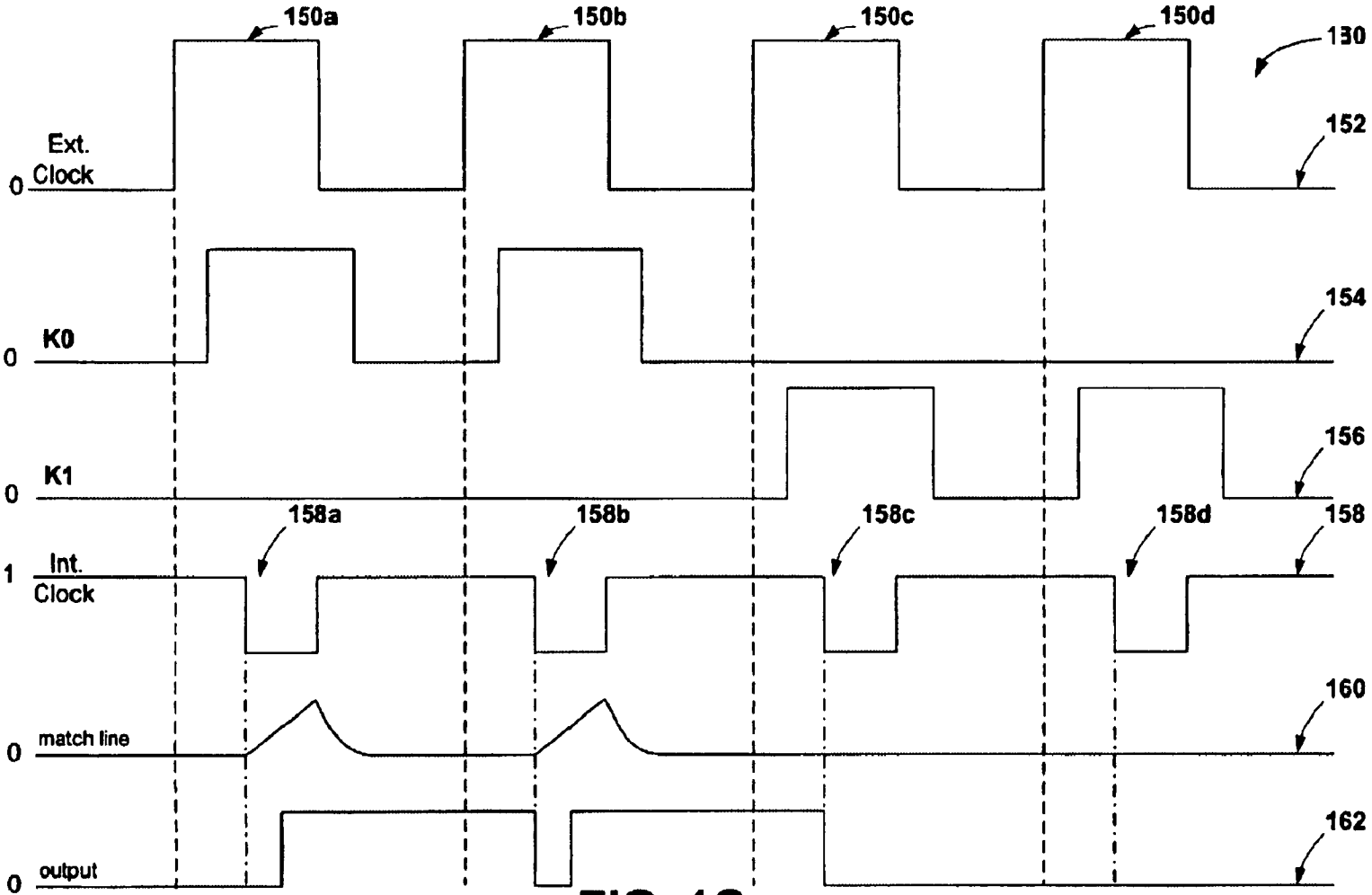
FIG. 1C is a diagram showing exemplary search signals for a conventional CAM.
Figure 2:
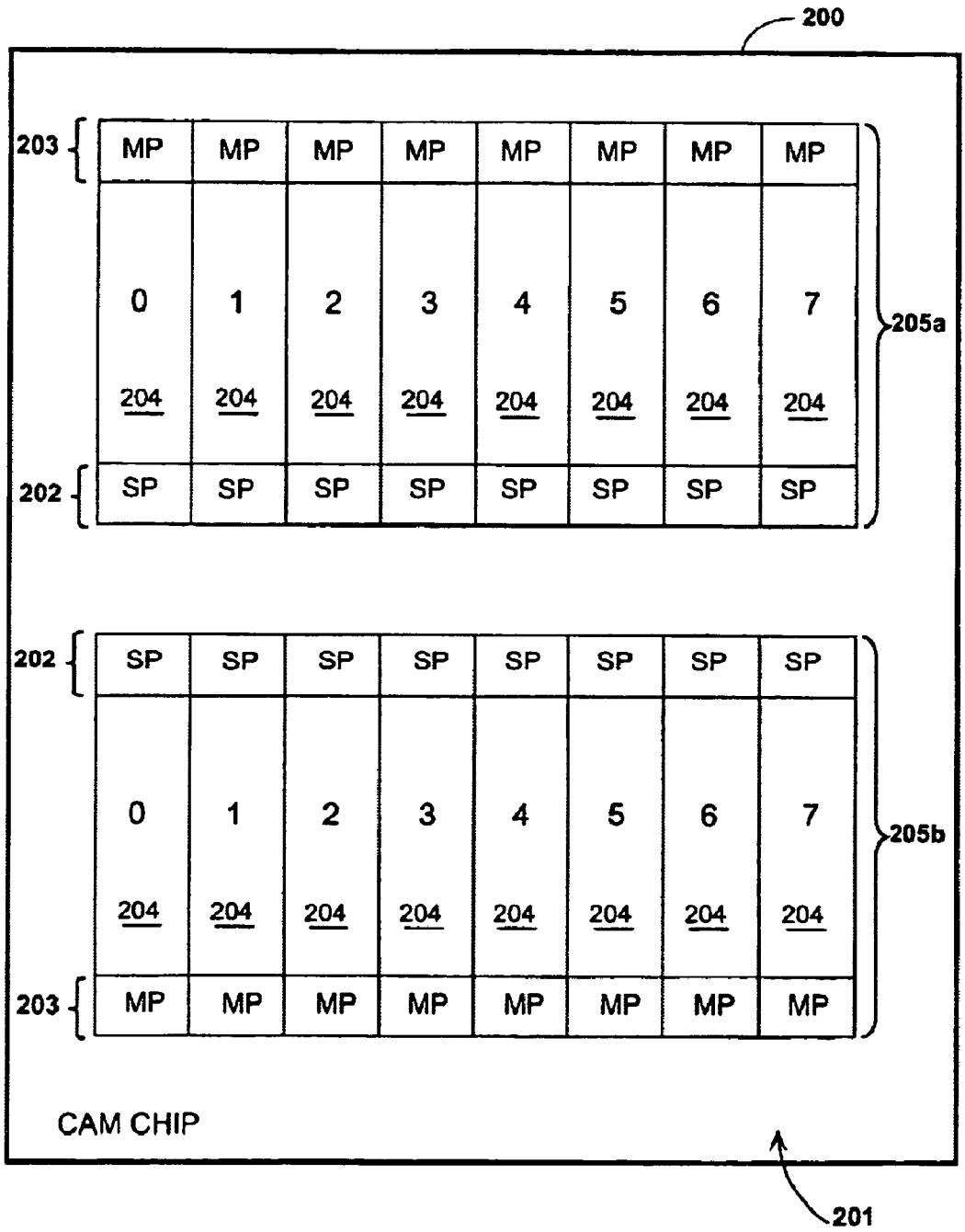
FIG. 2 illustrates a CAM chip including two macros, in accordance with one embodiment of the present invention.

FIGS. 1A-1C were described in terms of the prior art. FIG. 2 illustrates a CAM chip 200 including two macros 205a and 205b, in accordance with one embodiment of the present invention. A chip can, in other embodiments, include one or more macros 205 depending on the application. Each macro 205 is shown including a plurality of cores 204, and each core 204 is accompanied by its associated maintenance port (MP) 203 and search port (SP) 202. In this example, the CAM chip 200 has macros 205 that include eight cores 204 each. Thus, each core 204 is a two-port core having its associated MP 203 and SP 202. The search ports 202 are configured to incorporate circuitry for performing searches in the memory of each of the cores 204, and the maintenance ports 203 assist in performing write operations, read operations, and other maintenance-related operations to each of the associated cores 204.

Figure 3:
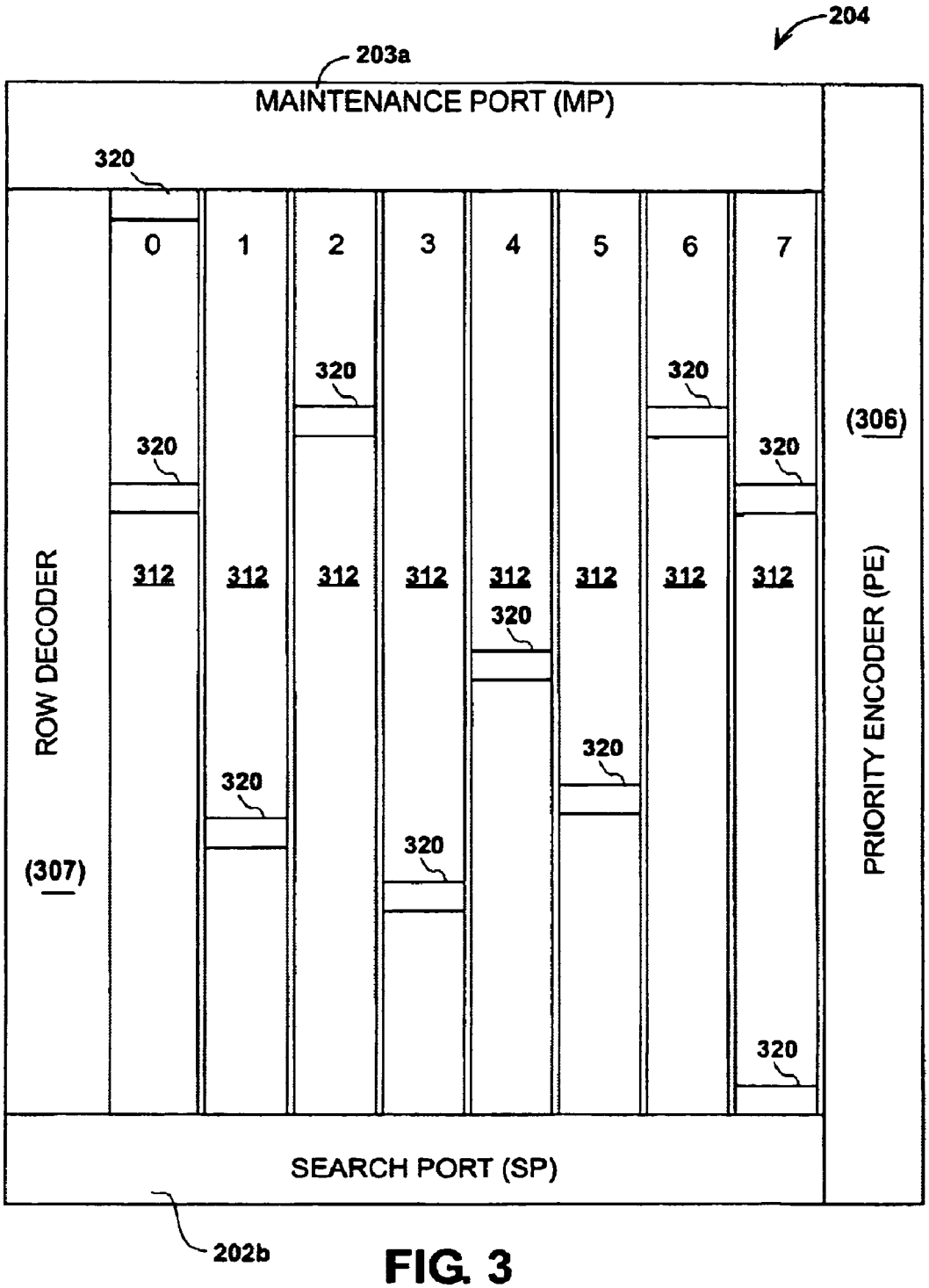
FIG. 3 illustrates a single core that incorporates its own maintenance port and its own search port, in accordance with an embodiment of the present invention.

FIG. 3 illustrates a single core 204 that incorporates its own maintenance port 203a and its own search port 202b, in accordance with an embodiment of the present invention. Each core 204 includes a plurality of sub-blocks 312. In this example, the core 204 has eight sub-blocks 312, and each sub-block 312 has a width to hold a 32-bit word 320, and extends to form a column of 512 rows. It should be understood that the actual "word" 320 width and rows of a sub-block can vary depending on the desired application.

The core 204 also includes a row decoder 307 and a priority encoder (PE) 306. As is well known, the priority encoder 306 is configured to prioritize which match of potentially many matches has the highest priority and thus, is most likely to be the address for the data being searched.

The maintenance port 203a is configured to enable the reading and writing to the addresses selected from the sub-blocks 312 in order to modify and update the contents of the memory for subsequent search operations. In a preferred embodiment, the maintenance port operations are performed independently from the search port 202b operations and are coordinated such that searches continue uninterrupted by way of the search port 202b, while the maintenance port 203a operations occur in parallel with the search operations.

The maintenance port 203a preferably includes a Z decoder that enables only one word in a selected sub-block 312 at one time. To accomplish this, a logical AND is performed between a global wordline and a Z decode line. In this manner, it is possible to access only one word 320 during a read or write operation. The implementation of a Z decode is also referred to as a divided wordline implementation.

Figure 4:
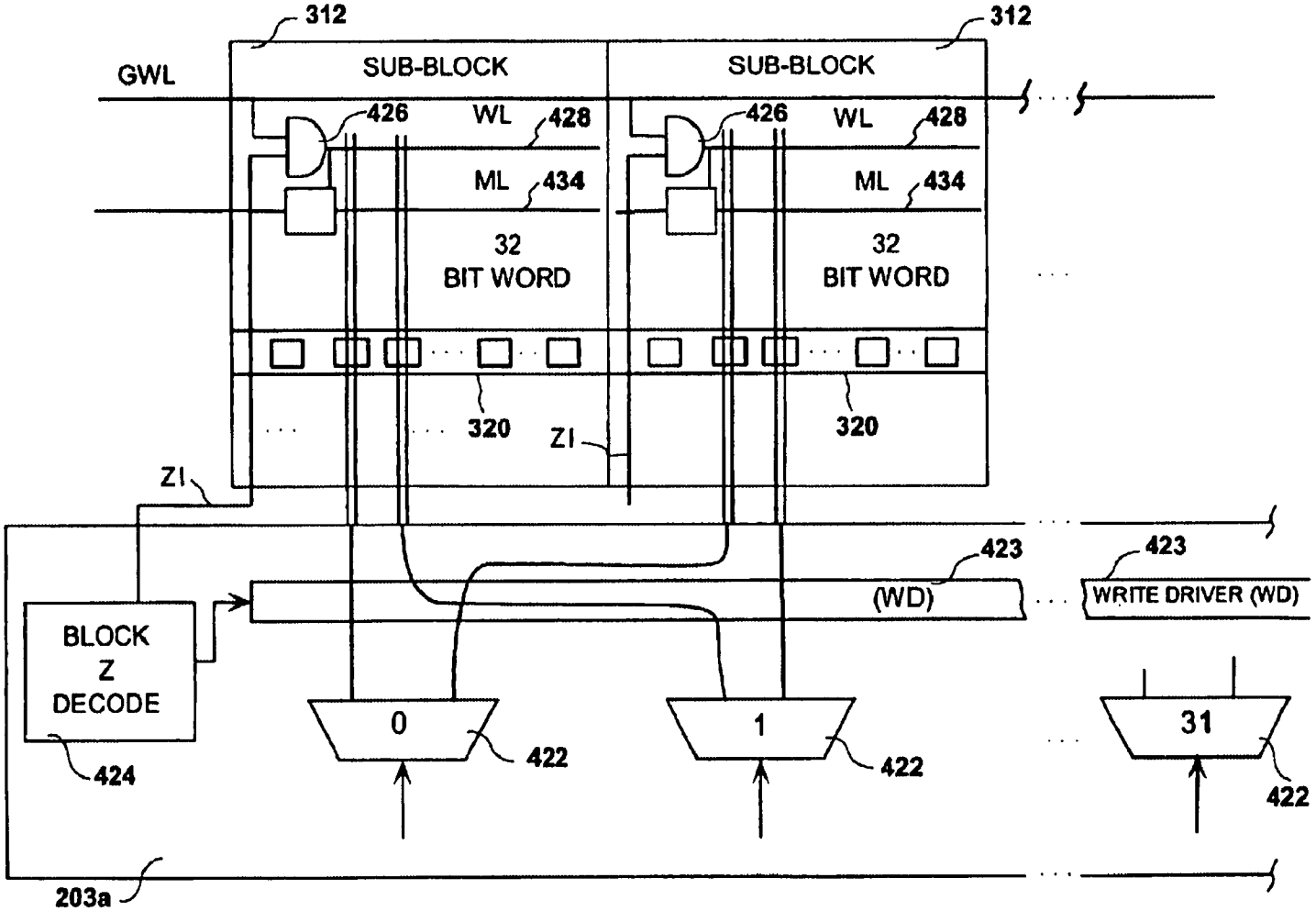
FIG. 4 illustrates a portion of the maintenance port and simplified versions of a sub-block, in accordance with an embodiment of the present invention.

For example, FIG. 4 illustrates a portion of the maintenance port 203a and simplified versions of a sub-block 312. Traversing each of the subblocks 312 is a global wordline (GWL). The GWL is coupled to a logical AND gate 426, which is also coupled to a Z decode line (Z1). The output of the AND gate 426 is a local wordline 428 for each sub-block 312. In this embodiment, the sub-block 312 is 32-bits in width and also includes a valid bit 320a. For completeness, a pair of exemplary bitlines is drawn vertically across each of the subblocks 312 and coupling to the local wordline 428. Thus, the AND gate 426 is configured to activate only one local wordline 428 depending upon the signals provided to the respective AND gates 426 which are coupled between Z decode lines (Z1). Inverse multiplexers 422 are provided within the maintenance port 203a and are configured to communicate with the bitlines of the individual sub-blocks 312. In a preferred embodiment, the maintenance port 203a includes 32 inverse multiplexers 422 that appropriately select the correct bitlines of the sub-blocks 312.

As shown in FIG. 4, in addition to a local wordline, each bit pattern entry in a sub-block 312 includes a local match line 434. Generally, each local match line 434 is asserted high during a search operation whenever the data associated with the local match line 434 matches the comparand of the search operation. This is often referred to as a "hit." Conversely, when the data associated with the local match line 434 docs not match the comparand of the search operation, the local match line 434 is pulled low, often referred to as a "miss."

Power Savings in Compare Lines

Figure 5:
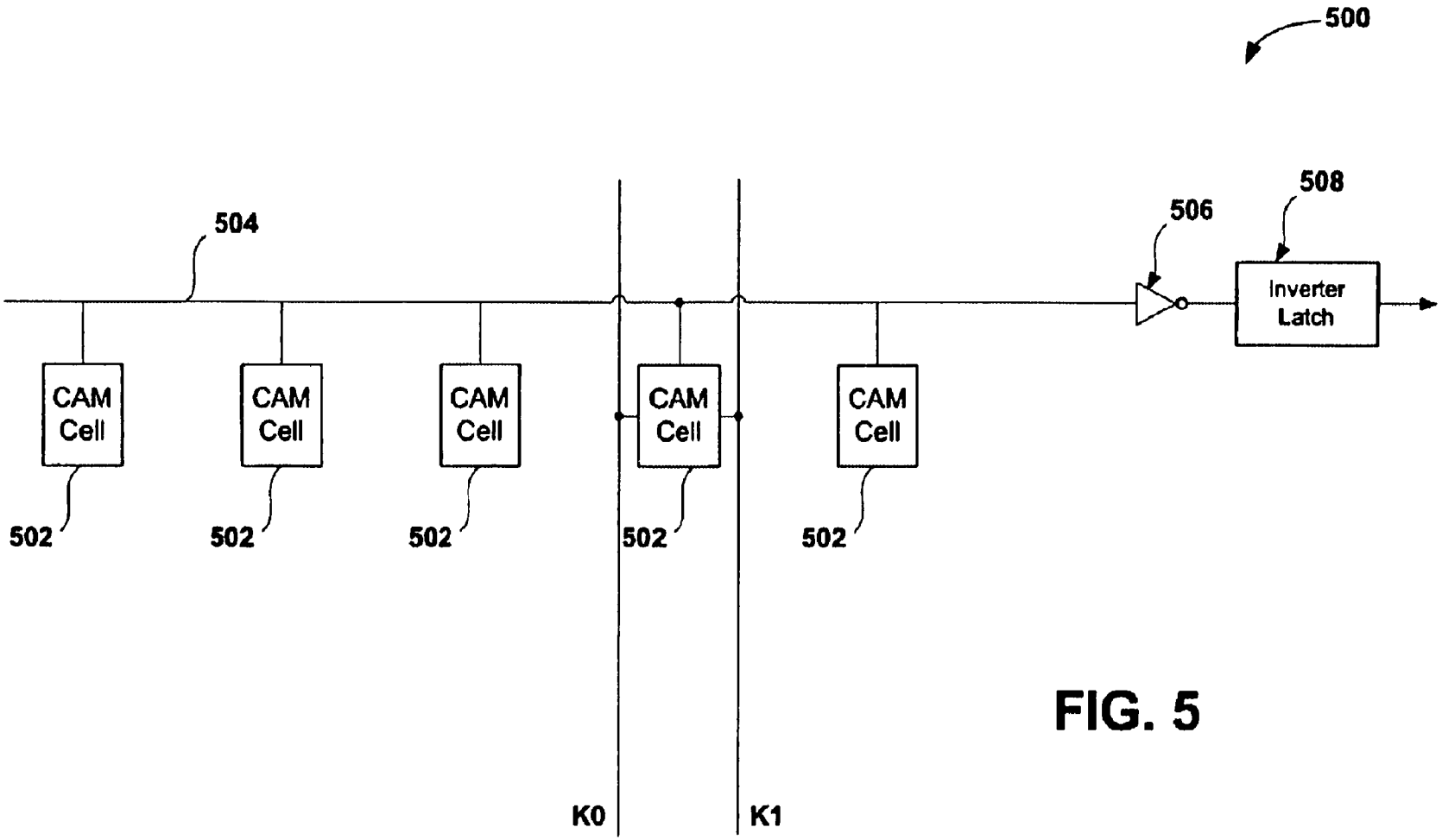
FIG. 5 is a schematic diagram showing a bit pattern entry, in accordance with an embodiment of the present invention.

FIG. 5 is a schematic diagram showing a bit pattern entry 500, in accordance with an embodiment of the present invention. The bit pattern entry 500 includes a plurality of CAM cells 502 coupled to a local match line 504. The local match line 504 is further coupled to an inverter 506, which is coupled to an inverter latch 508. Each CAM cell 502 is also coupled to a pair of compare lines K0 and K1. Although, for clarity, only one CAM cell 502 is shown coupled to compare lines in FIG. 5, it should be noted that all the CAM cells 502 are actually coupled to compare lines.

Figure 6:
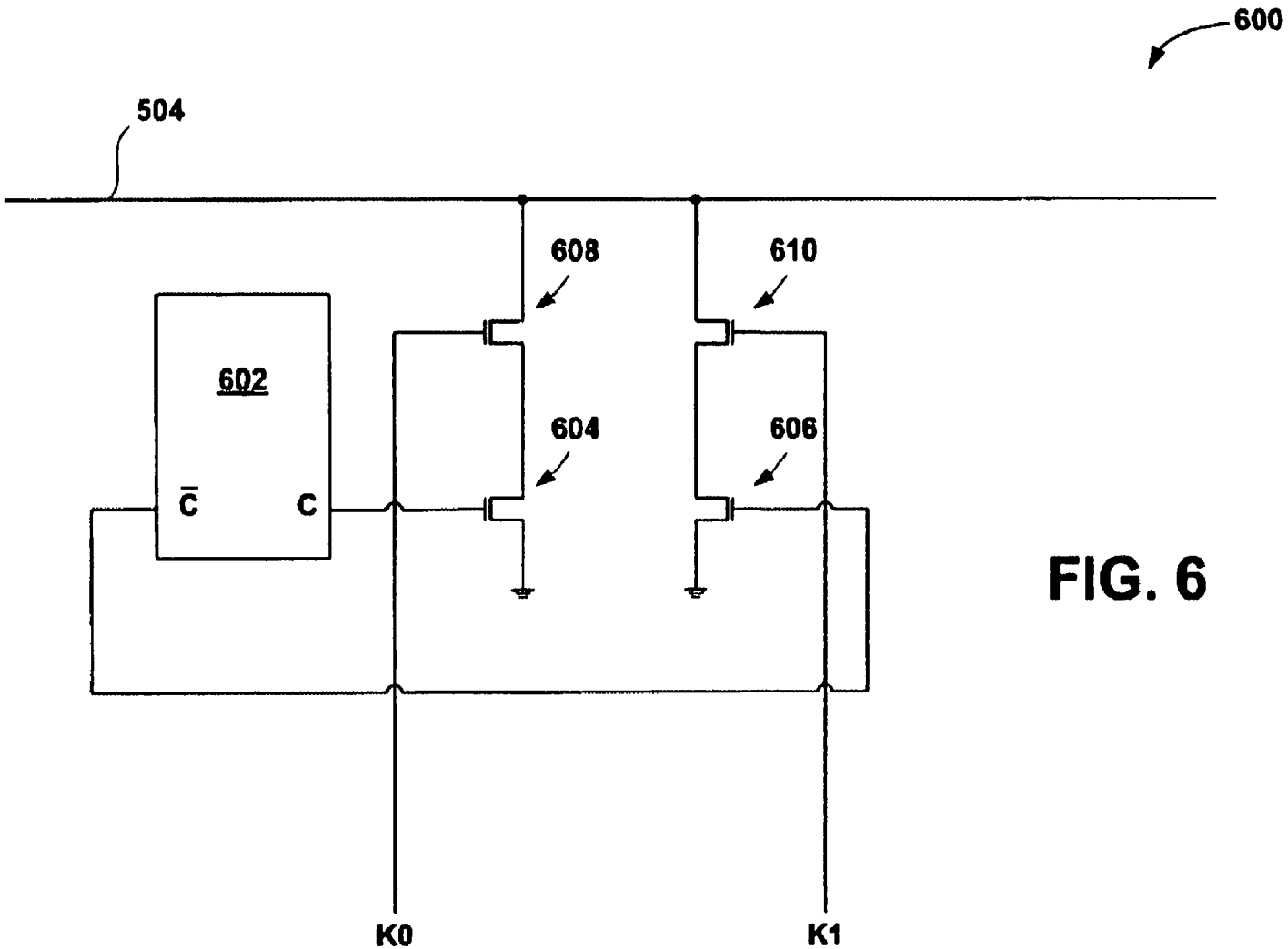
FIG. 6 is a schematic diagram showing a binary CAM cell, in accordance with an embodiment of the present invention.
Figure 7:
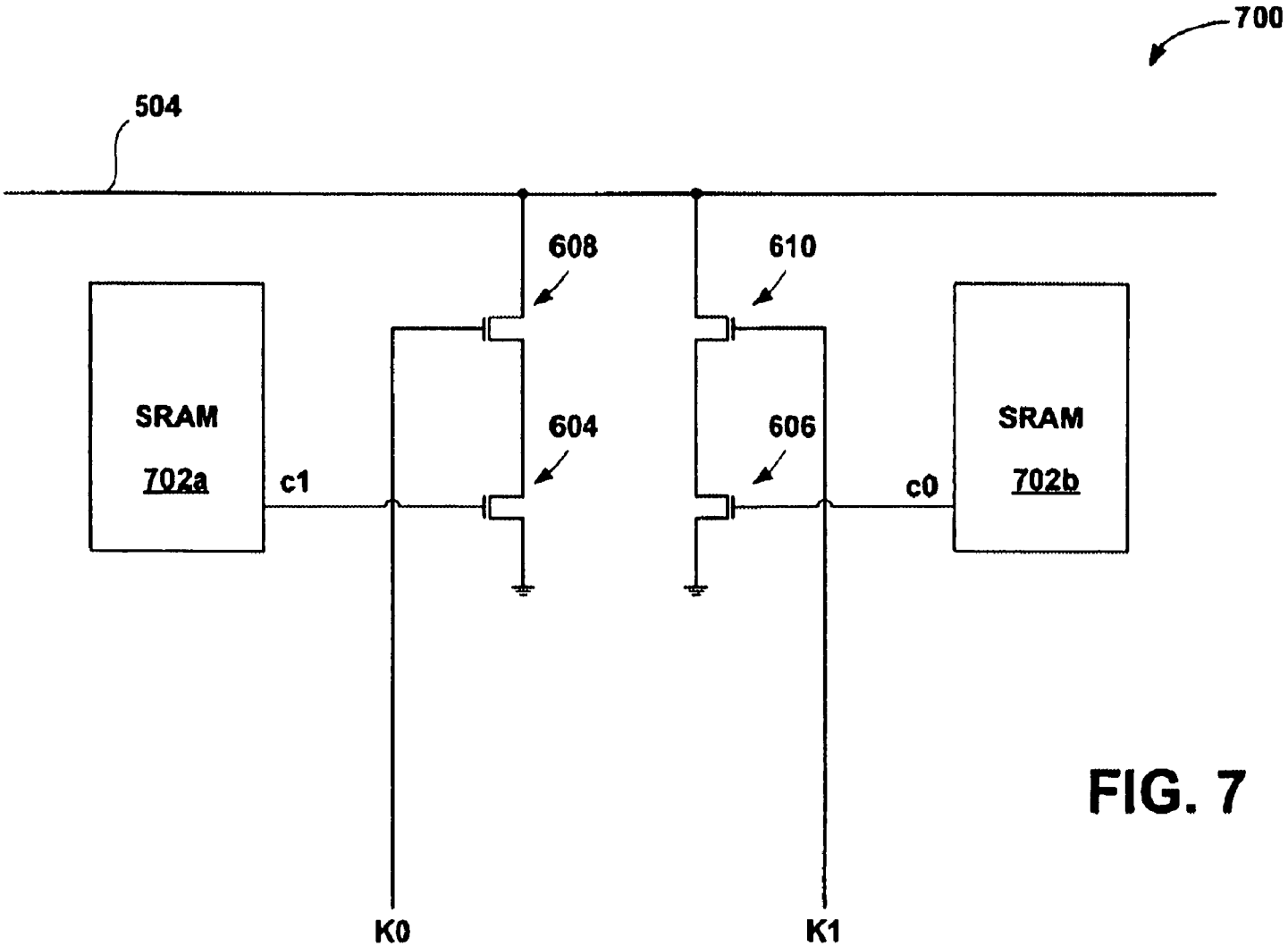
FIG. 7 is a schematic diagram showing a ternary CAM cell, in accordance with an embodiment of the present invention.

Each CAM cell 502 can be any type of CAM cell suitable for storing data for later search operations, such as a binary CAM cell or a ternary CAM cell as shown in FIGS. 6 and 7, respectively. FIG. 6 is a schematic diagram showing a binary CAM cell 600, in accordance with an embodiment of the present invention. The binary CAM cell 600 includes a storage element 602 having normal and complementary outputs c and [illegible] /c, and n-channel transistors 604-610. The normal output c of the storage element 602 is coupled to the gate of transistor 604, while the complementary output [illegible] /c of the storage element 602 is coupled to the gate of transistor 606. A first compare line K0 is coupled to the gate of transistor 608, and a second compare line K1 is coupled to the gate of transistor 610. In addition, one terminal of transistor 608 is coupled to the match line 504 and the other terminal of transistor 608 is coupled to a terminal of transistor 604. The other terminal of transistor 604 is coupled to ground. Further, a terminal of transistor 610 is also coupled to the match line 504 and the other terminal of transistor 610 is coupled to a terminal of transistor 606. The other terminal of transistor 606 is coupled to ground.

In operation, a value is stored in the storage element 602. The value stored in the storage element 602 is then placed on the normal output c, while the inverse of the stored value is placed on the complementary output [illegible] /c. During a search operation the search data is compared to the value stored in the storage element 602 using the compare lines K0 and K1. The search data comprises the actual values placed on the compare lines that represent the value being compared to the data stored in the CAM cell. More specifically, the value being compared is placed on compare line K1, while the inverse is placed on K0. if the search data matches the value stored in the storage element 602, the match line 504 will remain high, otherwise the match line 504 will be grounded and pulled low.

For example, if a 1 is stored in the storage element 602, a 1 will be placed at the gate of transistor 604 thus turning transistor 604 on, while a 0 will be placed at the gate of transistor 606, thus turning transistor 606 off. If the search data for this particular binary CAM cell 600 is a 1, the compare line K1 will be high, or 1, while the compare line K0 will be low, or 0. As a result, a 1 will be placed at the gate of transistor 610, thus turning transistor 610 on, and a 0 will be placed at the gate of transistor 608, thus turning transistor 608 off. At this point, both paths to ground are now closed since transistors 606 and 608 are off. Thus, the charge on the match line will remain high.

On the other hand, if the search data for this particular binary CAM cell 600 is a 0, the compare line K1 will be low, or 0, while the compare line K0 will be high, or 1. As a result, a 0 will be placed at the gate of transistor 610, thus turning transistor 610 off, and a 1 will be placed at the gate of transistor 608, thus turning transistor 608 on. At this point, the path to ground comprising transistors 604 and 608 is now open, and as a result, the match line 504 will be grounded, and thus pulled low. Similar results occur when the value stored in the storage element is a 0. Another form of CAM cell is a ternary CAM cell as illustrated in FIG. 7.

FIG. 7 is a schematic diagram showing a ternary CAM cell 700, in accordance with an embodiment of the present invention. The ternary CAM cell 700 includes a pair of storage elements 702a and 702b, which can comprise any type of storage element capable of storing a binary value, such as a SRAM. The output c1 of storage element 702a is coupled to the gate of transistor 604, while the output c0 of storage element 702b is coupled to the gate of transistor 606. Otherwise, the ternary CAM cell is configured in a manner similar to the binary CAM cell of FIG. 6.

During operation the two storage elements 702a and 702b include values that are the inverse of each other. Thus, if the ternary CAM cell 700 stored a value of 1, storage element 702a would store a 1, while storage element 702b would store a 0. In this configuration, a search operations occurs in a manner similar to the binary CAM cell. However, the ternary CAM cell 700 further allows the storage of a "don't care" value that provides an unconditional match for any comparand used in searching the ternary CAM cell 700.

Generally, a don't care value is represented in the ternary CAM cell 700 by storing a 0 in both storage elements 702a and 702b. In this case, transistors 604 and transistors 606 will both be turned off, thus blocking any path to ground from the match line 504 through the ternary CAM cell 700. Thus, the match line 504 will be allowed to remain high regardless of what values are placed on compare lines K0 and K1. Another way to force an unconditional match in both the ternary CAM cell 700 and the binary CAM cell 600, is by placing a 0 on both compare lines K0 and K1. This is also referred to as "masking". When this done both transistors 608 and 610 will turn off, thus blocking any path to ground from the match line 504 through the CAM cell. As a result, the match line 504 will be allowed to remain high regardless of what value is stored in the CAM cell.

Referring back to FIG. 5, embodiments of the present invention reduce the number of transitions occurring on the compare lines K0 and K1 by allowing the compare lines to remain in the same state from clock cycle to clock cycle when the search data remains the same.

Figure 8:
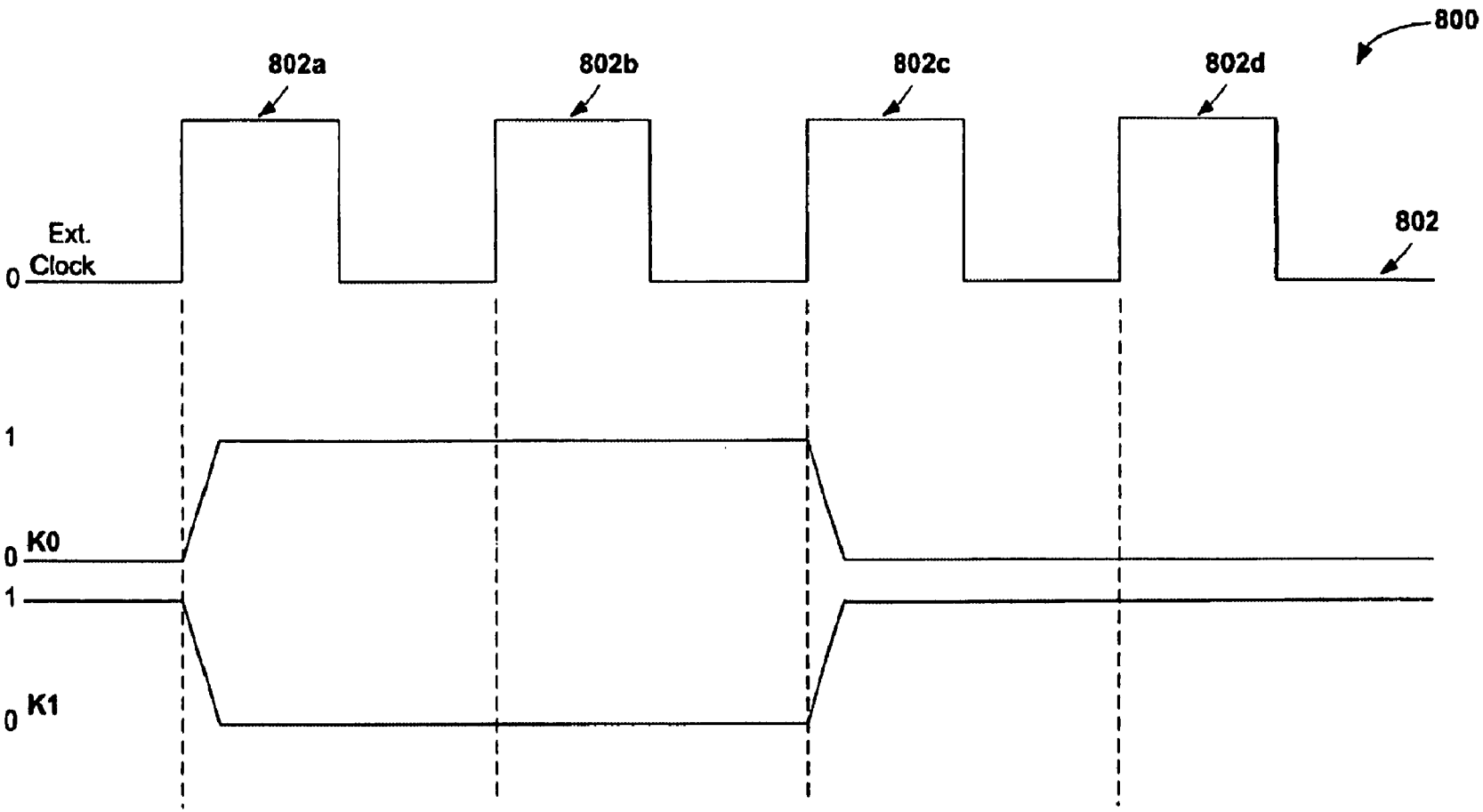
FIG. 8 is a diagram showing exemplary search signals, in accordance with an embodiment of the present invention.

FIG. 8 is a diagram showing exemplary search signals 800, in accordance with an embodiment of the present invention. The search signals 800 include an external search clock 802, a first compare line K0 and a second compare line K1. As previously mentioned, prior art CAMs reset both compare lines to a predictable value of zero before each search each clock cycle, which resulted in unwanted transitions. The embodiments of the present invention reduce the number of transitions occurring on the compare lines. The compare lines K0 and K1 are not precharged to zero each clock cycle, instead the compare lines K0 and K1 are allowed to remain in the same state during consecutive clock-cycles if the search data placed on the compare lines remains the same.

FIG. 8 shows an example in which the search data for compare lines K0 and K1 remains the same for first and second external clock cycles 802a and 802b. The search data then changes between second and third external clock cycles 802b and 802c, and finally, remains the same between the third and fourth external clock cycles 802c and 802d. As shown in FIG. 8, initially the value of compare line K0 is 0 and the value of compare line K1 is 1. At the leading edge of the first external clock cycle 802a the values change such that compare line K0 transitions to a value of 1 and compare line K1 transitions to a value of 0.

At the leading edge of the second external clock cycle 802b the compare lines are updated. However, since the search data remains the same between the first and second external clock cycles 802a and 802b, the compare lines K0 and K1 are allowed to retain the same values. At the leading edge of the third external clock cycle 802c, the search data changes. As a result, the compare lines are updated to their new values, in this case, compare line K0 transitions to a value of 0 while compare line K1 transitions to a value of 1. The data then remains the same between the third and fourth external clock cycles 802c and 802d, and allowed to retain the same values. Comparing FIG. 8 to prior art FIG. 1C, for the same search data sequence four transitions occur in the compare lines of the conventional CAM, while only two transitions occur in the compare lines of a CAM of the embodiments of the present invention. The reduced compare line transitions of the embodiments of the present invention result in large power savings.

Statistically, the chance of a particular compare line changing in a normal CAM operation is about 50%. Thus, the embodiments of the present invention reduce the number of transition occurring on the compare lines of the CAM by about half. As a result, the power in the compare lines in the embodiments of the present invention is reduced by about 50% as compared to the power in the compare lines of convention CAM devices.

Figure 9:
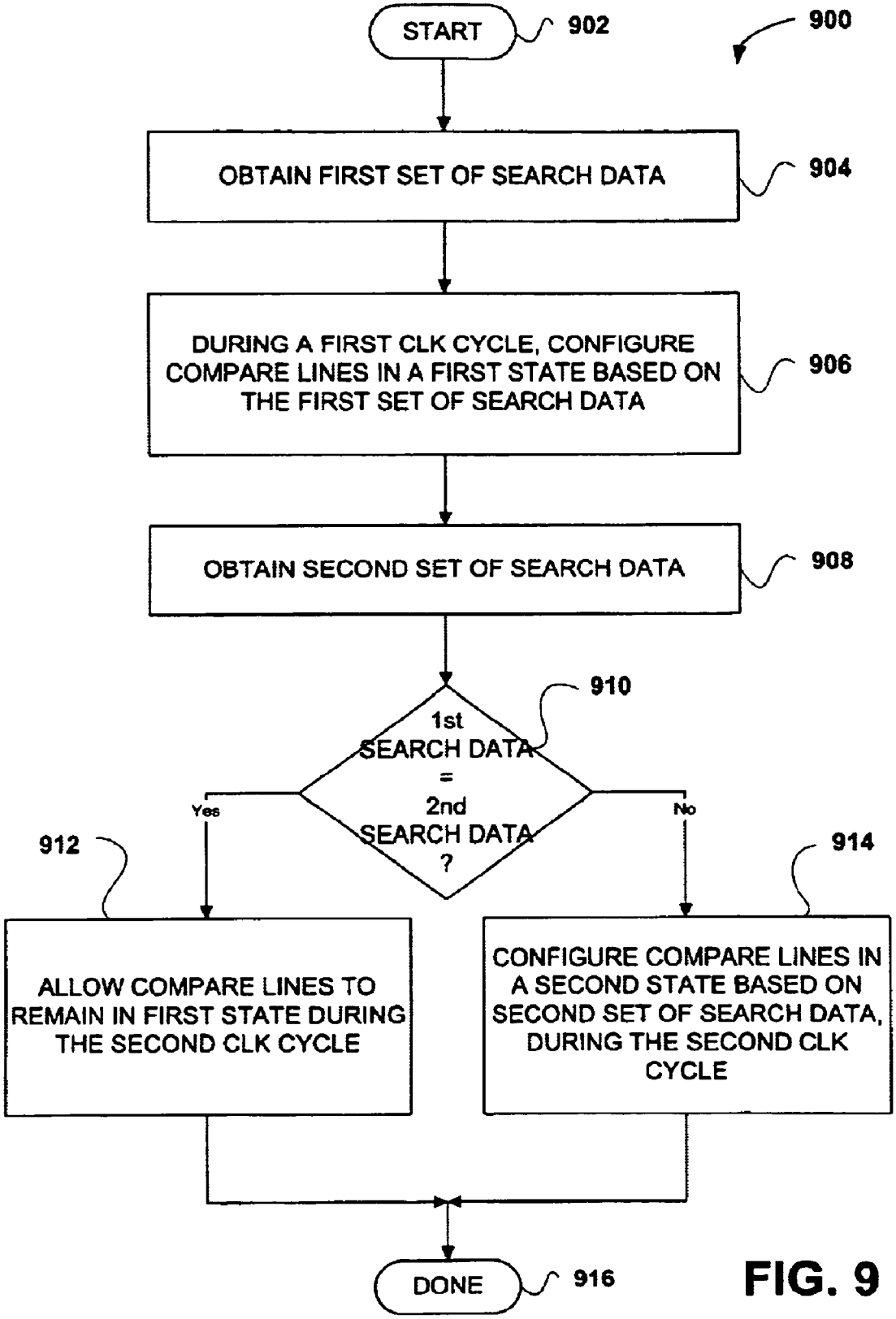
FIG. 9 is a flowchart showing a method for low power searching in a CAM, in accordance with an embodiment of the present invention.

FIG. 9 is a flowchart showing a method 900 for low power searching in a CAM, in accordance with an embodiment of the present invention. In an initial operation 902, preprocess operations are performed. Preprocess operations include configuring the storage locations of the CAM, and other preprocess operations that will be apparent to those skilled in the art.

In operation 904, a first set of search data is obtained. Generally, the search data is obtained from the search port of the CAM. In particular, a comparand is obtained from the search port. Each bit of the comparand is then used as search data for a particular CAM cell of a bit pattern entry. This search data is then used to search the particular CAM cell of the bit pattern entry. If the search data for a particular CAM cell matches the data stored in the CAM cell, the CAM cell does not pull the match line low. However, if the search data for the particular CAM cell does not match the data stored in the CAM cell, the CAM cell pulls the match line low. After obtaining the first set of search data the compare lines are configured in operation 906.

During a first clock cycle, the compare lines for the CAM cell are configured in a first state based on the first set of search data, in operation 906. Specifically, the search data for the CAM cell is placed on the compare lines. Generally, the search data comprises inverse signals placed on the compare lines, which is then compared to the data stored in the CAM cell. If the search data represented by the compare lines matches the data stored in the CAM cell, the CAM cell will not ground the local match line. Otherwise, the CAM cell grounds the local match line, thus pulling the match line low.

After performing a search using the first set of search data, a second set of search data is obtained, in operation 908. During the next clock cycle new search data is obtained from the search port for another search. It should be borne in mind that the new search data statistically has a 50% chance of changing from the first set of search data for the CAM cell. Thus, 50% of time the data on the compare lines does not change.

A decision is then made as to whether the second set of search data is equivalent to the first set of search data, in operation 910. If the second set of search data is equivalent to the first set of search data, the method 900 continues with operation 912. Otherwise, the method 900 continues with operation 914.

The compare lines are allowed to remain in the first state during the second clock cycle, in operation 912. The embodiments of the present invention reduce the number of transitions occurring on the compare lines. The compare lines are not precharged to zero each clock cycle. Instead, the compare lines are allowed to remain in the same state during consecutive clock cycles if the search data placed on the compare lines remains the same.

The compare lines are configured in a second state based on the second set of search data during the second clock cycle, in operation 914. If the second set of search data is different from the first set of search data for the CAM cell, the compare lines are either inverted or both set low depending on the value of the second set of search data. Generally, both compare lines will be set low only when the search data is masked to indicate a "don't care."

Post process operations are performed in operation 916. Post process operations include performing maintenance operations on the CAM cells, continued search operations, and other post process operations that will be apparent to those skilled in the art. Statistically, the chance of a particular compare line changing in normal CAM operation is about 50%. Thus, the embodiments of the present invention advantageously reduce the number of transition occurring on the compare lines of the CAM by about half. As a result, the power in the compare lines in the embodiments of the present invention is reduced by about 50% as compared to the power in the compare lines of convention CAM devices.

Power Savings in Match Line—No Precharge

In addition, to saving power in the compare lines during search operations, embodiments of the present invention further save power in the match lines of the present invention by avoiding precharge operations.

Figure 10:
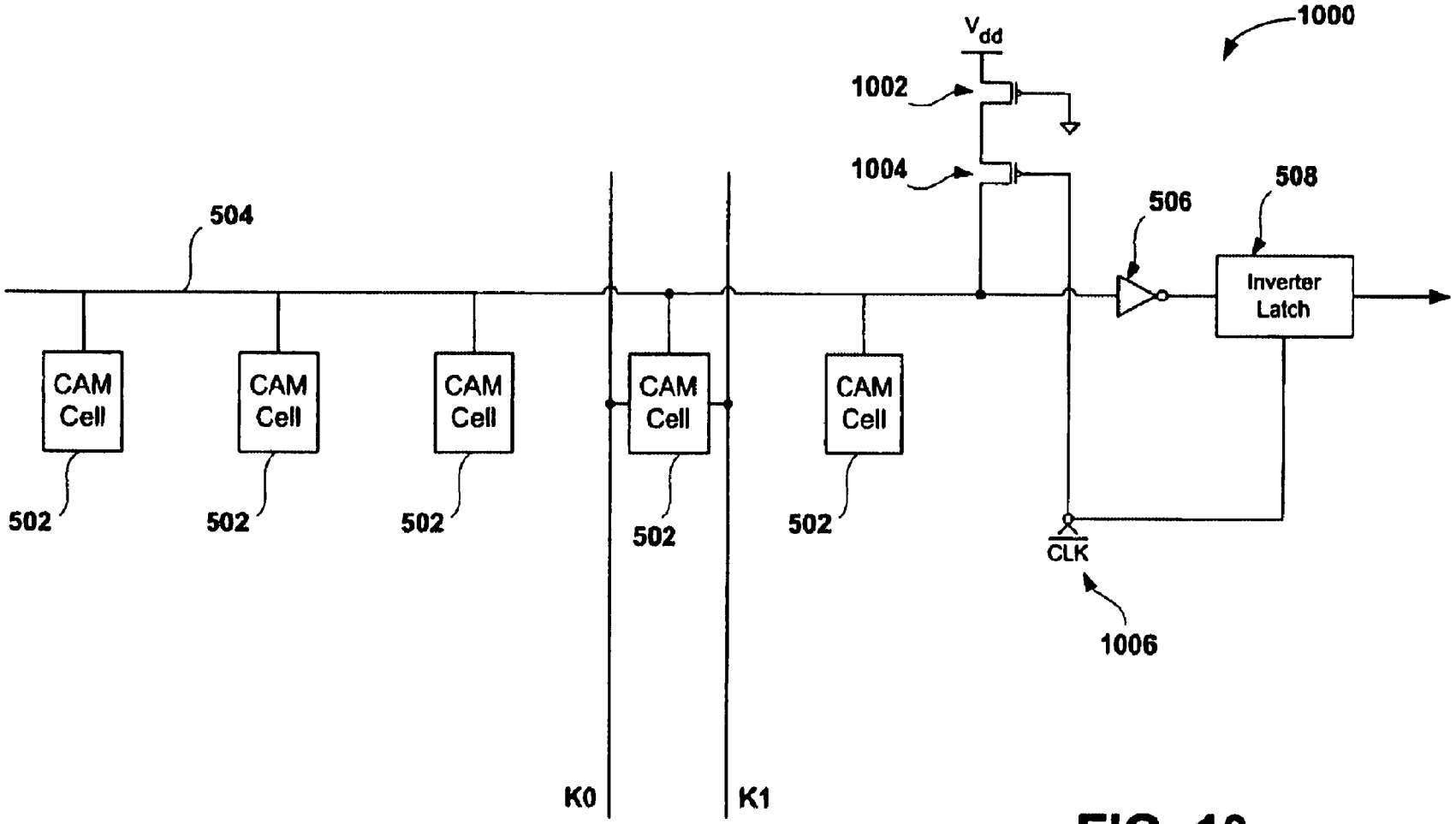
FIG. 10 is a schematic diagram showing a bit pattern entry, in accordance with an embodiment of the present invention.

FIG. 10 is a schematic diagram showing a bit pattern entry 1000, in accordance with an embodiment of the present invention. The bit pattern entry 1000 includes a plurality of CAM cells 502 coupled to a local match line 504. The local match line 504 is further coupled to an inverter 506, which is coupled to an inverter latch 508. Each CAM cell 502 is also coupled to a pair of compare lines K0 and K1. Although, for clarity, only one CAM cell 502 is shown coupled to compare lines in FIG. 10, it should be noted that all the CAM cells 502 are actually coupled to compare lines. Each CAM cell 502 can be any type of CAM cell suitable for storing data for later search operations, such as a binary CAM cell or a ternary CAM.

Further included in the bit pattern entry 1000 are a first and second p-channel transistors 1002 and 1004, and an internal clock 1006. The gate of transistor 1002 is coupled to ground. Further, the source of transistor 1002 is coupled to $V_{dd}$ while the drain of transistor 1002 is coupled to the source of transistor 1004. The drain of transistor 1004 is coupled to the local match line 504, and the gate of transistor 1004 is coupled to the internal clock 1006. The internal clock 1006 is also coupled to the inverter latch 508. Transistors 1002 and 1004 form a current generator, which is controlled by the internal clock 1006. In one embodiment, the internal clock 1006 is an inverted clock, and is pulsed after the external clock updates the compare lines K0 and K1.

The embodiments of the present invention reduce power usage in a CAM by allowing the match line to remain charged during consecutive match results. More specifically, since the gate of transistor 1002 is tied to ground, transistor 1002 remains open to provide current from $V_{dd}$. The gate of transistor 1004 is coupled to the internal clock 1006, which is an inverted clock, thus whenever the internal clock 1006 is pulsed transistor 1004 turns on, which allows current to flow from $V_{dd}$ to the match line 504. The period of time when the internal clock 1006 is low, and thus current is being injected into the match line 504, will be referred to as the active search.

During the active search, current from $V_{dd}$ is provided to the match line 504. However, unlike conventional CAMs, embodiments of the present invention do not precharge the match line 504 to zero prior to each search operation. Hence, the match line 504 of the embodiments of the present invention, generally only discharges when a CAM cell does not match the search data and thus pulls the match line 504 low.

Figure 11:
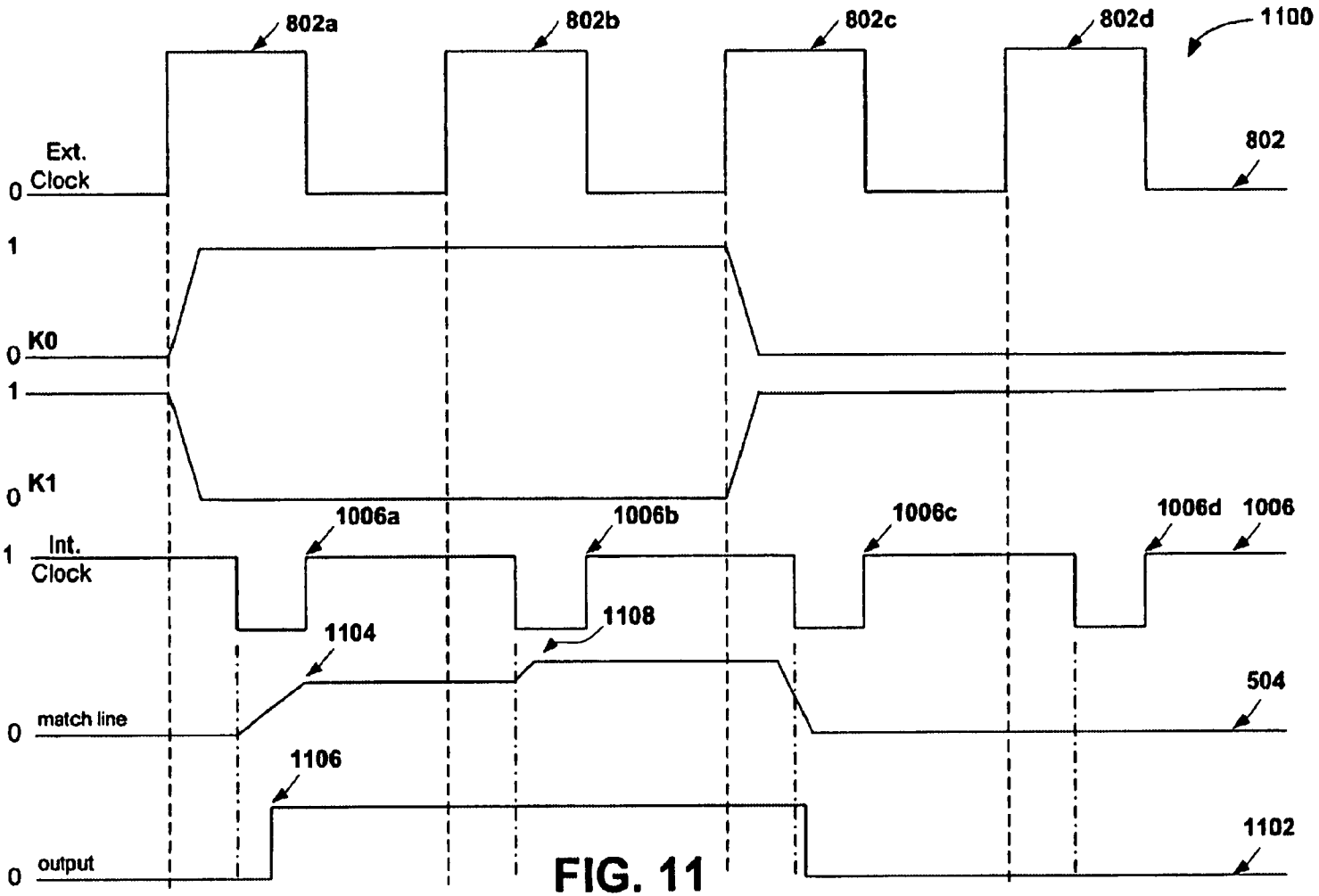
FIG. 11 is a diagram showing exemplary search signals including the search output for a bit pattern entry, in accordance with an embodiment of the present invention.

FIG. 11 is a diagram showing exemplary search signals 1100 including the bit pattern entry output, in accordance with an embodiment of the present invention. The exemplary search signals 1100 include the external clock 802, compare lines K0 and K1, the internal clock 1006, the match line 504, and the bit pattern entry output 1102.

FIG. 11 shows an example in which the search data for compare lines K0 and K1 remains the same for first and second external clock cycles 802a and 802b, and changes between the second and third external clock cycles 802b and 802c. The search data for the compare lines K0 and K1 then remains the same between the third and fourth external clock cycles 802c and 802d. Further, the comparand of the search operations matches the bit pattern entry during the first and second external clock cycles 802a and 802b, and does not match the bit pattern entry during the third and fourth external clock cycles 802c and 802d. As will be seen, embodiments of the present invention reduce power usage during search operations by allowing the match line to remain charged between consecutive matches, thus avoiding precharging of the match line 504.

In operation, the search data is placed on the compare lines K0 and K1 at the beginning of the first external clock signal 802a. After the compare lines K0 and K1 have attained their appropriate values, the internal clock 1006 is pulsed to begin the first active search 1006a. During the active search the match line 504 begins to ramp up to point 1104 as a result of being charged by the current generator, comprised of transistor 1002 and 1004. As the match line 504 ramps up during the first active search 1006a, the inverter 506 and inverter latch 508 coupled to the match line 504 transition the output 1102 from low to high, at point 1106. It should be noted that the voltage of the match line 504 at point 1104 may or may not be equal to $V_{dd}$ depending on the particular implementation. However, if the voltage of the match line 504 at point 1104 is not $V_{dd}$, the match line voltage at point 1104 will preferably be sufficiently high to drive the bit pattern entry output 1102 high at point 1106.

Since in this example the search data remains the same during the second external clock cycle 802b, the data stored in the bit pattern entry will again match the comparand during the second external clock cycle 802b. Thus, at the leading edge of the second internal clock pulse 1006b, the match line 504 is again injected with current from the current generator. As previously mentioned, the previous match line current at point 1104 may not be equal to $V_{dd}$. However, a second consecutive match result on the match line 504 will generally ramp the match line up to $V_{dd}$ at point 1108.

Unlike a conventional CAM, which precharges the match line to zero prior to each active search, embodiments of the present invention do not automatically discharge the match line 504 between active searches. Thus, if the match line 504 is high as a result of a match during the previous clock cycle, the match line 504 will remain high at the leading edge of the subsequent clock cycle if the comparand continues to match the data stored in the bit pattern entry.

Moreover, since the output 1102 follows the match line 504, the output 1102 remains high for the duration of the first and second internal clock cycles 1006a and 1006b. More specifically, during the consecutive matches occurring in the first and second external clock cycles 802a and 802b, the voltage of the match line 504 remains at a high level, thus continuously driving the output 1102 of the bit pattern entry high for the first and second clock cycles.

Then, during the third external clock cycle 802c, the comparand changes and no longer matches the data stored in the bit pattern entry. As the compare lines K0 and K1 change to the new values of the comparand, the CAM cells of the bit pattern entry that do not match the new comparand data will pull the match line 504 low. As a result, during the third active search 1006c the output 1102 goes low when the voltage of the match line 504 reaches a level that is too low to drive the output 1102 high. In addition, since the comparand also does not match the data stored in the bit pattern entry in the fourth external clock cycle 802d, the non-matching CAM cells again pull the match line 504 low. As a result, the output 1102 remains low during the fourth active search 1006d.

Each output 1102 for each bit pattern entry in the CAM is coupled to a global match line, which is a long line that provides the search results to other areas of the CAM for further processing, such as to priority encoders. The long length of the global match lines results in each global match line having a large capacitance. As a result, every transition on a global match line requires a large amount of power to overcome the large capacitance of the global match line. Since the output signals from the bit pattern entries propagate to the global match lines, every transition in the output signals results in a large power drain on the CAM.

Advantageously, transitions occur in the match line outputs 1102 of the embodiments of the present invention only when there is a match change from a miss result to a match result, or a match result to a miss result. Comparing the match line output 1102 of the present invention with the match line output 162 of a conventional CAM, as shown in FIG. 1C, twice the number of transitions occur in the prior art match line output 162 than occur in the match line output 1102 of the present invention. This is a result of the precharging of the match line 162 that occurs in a conventional CAM between active searches. During consecutive match results or during consecutive miss results in the embodiments of the present invention there are no transitions in the match line output 1102. The reduced match line output 1102 transitions also reduces number of transitions occurring in the global match lines throughout the CAM, resulting in tremendous power savings for the CAM as a whole.

Figure 12:
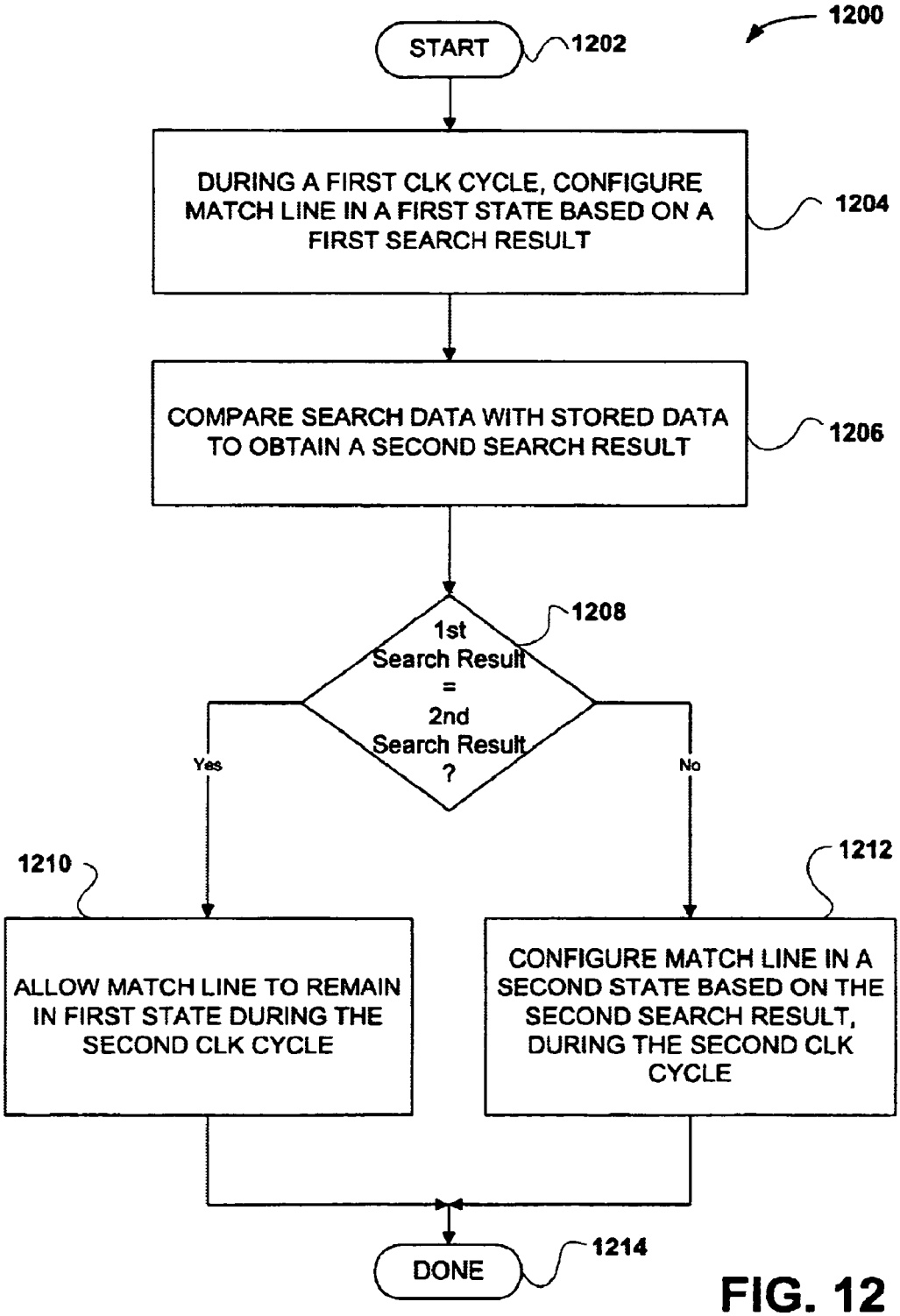
FIG. 12 is flowchart showing a method for low power searching in a CAM having reduced output transitions, in accordance with an embodiment of the present invention.

FIG. 12 is flowchart showing a method 1200 for low power searching in a CAM having reduced output transitions, in accordance with an embodiment of the present invention. In an initial operation 1202, preprocess operations are performed. Preprocess operations include configuring the bit pattern entries for the CAM, obtaining a comparand from the search port, and other preprocess operations that will be apparent to those skilled in the art.

During operation 1204, the match line is configured in a first state based on a first search result. After the comparand is compared to the data stored in the bit pattern entry, the result of that comparison is known as a search result. In operation, the match line for the bit pattern entry is configured to reflect the search result. Typically, the match line is configured to be high when the search result is a hit, and low when the search result is a miss. However, embodiments of the present invention can be configured such that the match line is low when the search result is a hit, and high when the search result is a miss. Thus, in operation 1204, the match line is configured in a first state, signifying a hit or a miss depending on the particular configuration of the CAM.

In operation 1206, search data for a subsequent search is compared with the data stored in the bit pattern entry to obtain a second search result. A comparand is obtained from the search port. Each bit of the comparand is then used as search data for a particular CAM cell of the bit pattern entry. This search data is then used to search the particular CAM cell of the bit pattern entry. The result of the comparison of the comparand to the bit pattern entry is the second search result.

A decision is then made as to whether the second search result is equivalent to the first search result, in operation 1208. If the second search result is equivalent to the first search result, the method 1200 continues with operation 1210. Otherwise, the method 1200 continues with operation 1212.

The match line is allowed to remain in the first state during the second clock cycle, in operation 1210. Unlike a conventional CAM, which precharges the match line to zero prior to each active search, embodiments of the present invention do not automatically discharge the match line between active searches. Thus, if the match line is high as a result of a match during the previous clock cycle, the match line will remain high at the leading edge of the subsequent clock cycle if the comparand continues to match the data stored in the bit pattern entry. Correspondingly, if the match line is configured such that a high result signifies a miss, the match line will remain high during consecutive misses. During consecutive matches occurring in the first and second clock cycles, the voltage of the match line remains at a high level, thus continuously driving the output of the bit pattern entry high for the first and second clock cycles.

The match line is configured in a second state based on the second search result, in operation 1212. When the search results on consecutive clock cycles are not equivalent the match line transitions from one state to a second different state. In this case, the match line transitions from the first state to a second state to signify the data no longer matches, or in some cases as described above, the data now matches the comparand. In one embodiment, if the search data for a particular CAM cell matches the data stored in the CAM cell, the CAM cell does not pull the match line low. However, if the search data for the particular CAM cell does not match the data stored in the CAM cell, the CAM cell pulls the match line low.

Post process operations are performed in operation 1214. Post process operations include CAM maintenance operations, subsequent search operations, and other post process operations that will be apparent to those skilled in the art. As previously mentioned, transitions occur in the march line outputs of the embodiments of the present invention only when there is a match change from a miss result to a match result, or a match result to a miss result. During consecutive match results or during consecutive miss results in the embodiments of the present invention there are no transitions in the match line output. The reduced match line output 1102 transitions also reduces the number of transitions occurring in the global match lines throughout the CAM, resulting in tremendous power savings for the CAM as a whole.

Figure 13:
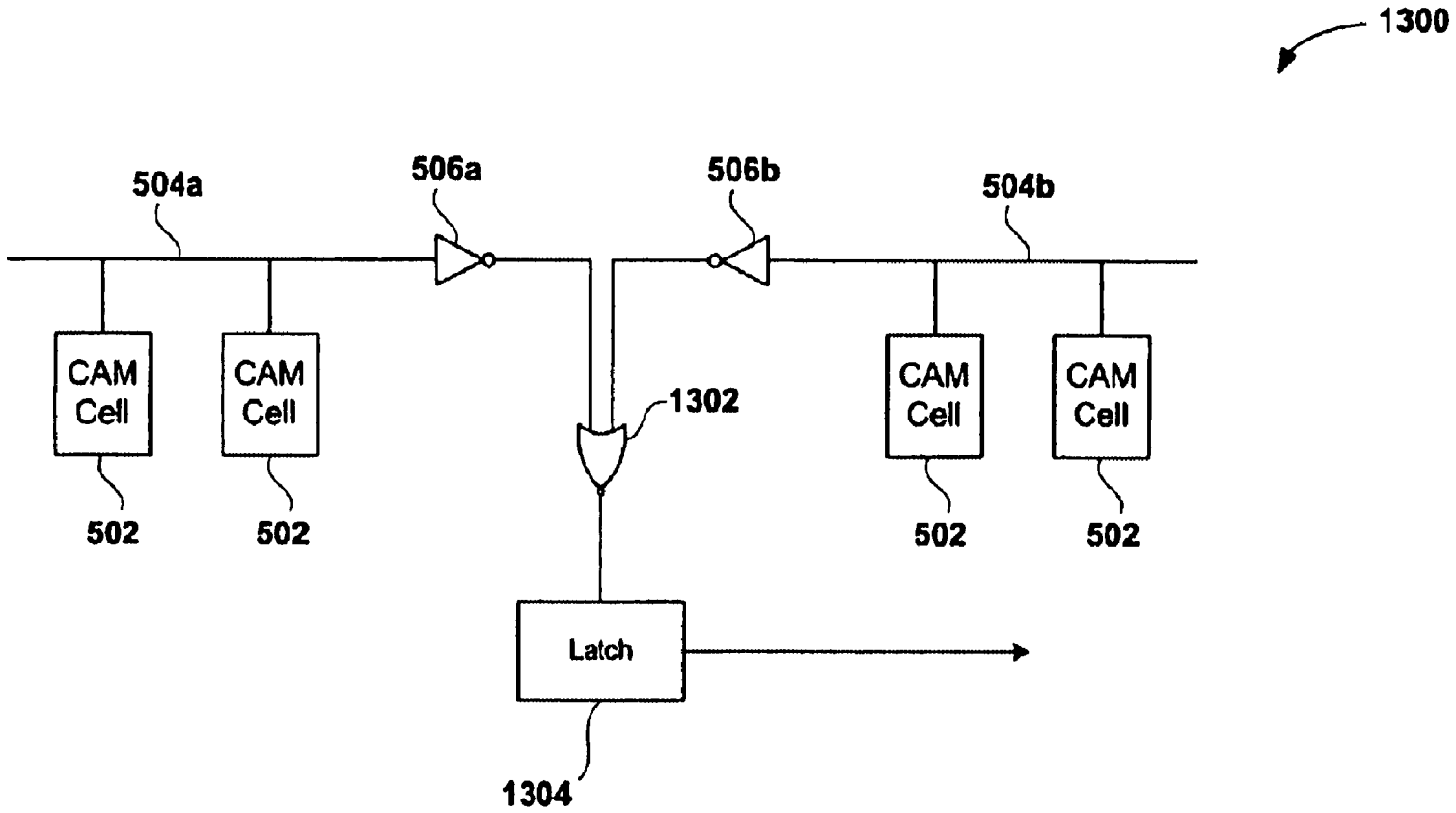
FIG. 13 is a schematic diagram showing a divided bit pattern entry, in accordance with an embodiment of the present invention.

To increase the speed of searches without affecting power consumption, the match line can be divided in two. FIG. 13 is a schematic diagram showing a divided bit pattern entry 1300, in accordance with an embodiment of the present invention. The divided bit pattern entry 1300 includes a plurality of CAM cells 502 coupled to a match line comprised of two sub-match lines 504a and 504b. Sub-match line 504a is coupled to a first inverter 506a, which is coupled to a NOR gate 1302. Similarly, sub-match line 504b is coupled to a second inverter 506b, which is coupled to the NOR gate 1302. The NOR gate 1302 is further coupled to a latch 1304.

Individually, each sub-match line 504a and 504b of the divided bit pattern entry 1300 functions similar to the match line 504 of FIG. 10. The signals from each sub-match line 506a and 506b are then combined using the NOR gate 1302. The NOR gate 1302 ensures that the signal provided to the latch 1304 will be high only when both sub-match lines 506a and 506b are high. If either sub-match line 506a or 506b is pulled low by a non-matching CAM cell 502, the signal provided to the latch 1304 will be low. The latch 1304 then latches the match line output until the next active search. The divided bit pattern entry 1300 reduces the amount of capacitance from the match line by reducing the length of the match line in half, using the two sub-match lines 506a and 506b. The reduced match line capacitance results in higher speed of the search operations.

Power Savings in Match Line—NOR/NOR Type Search

The majority of power used during search operations involves the injection of current into the local match lines of the CAM during search operations. Embodiments of the present invention address this issue by reducing the amount of current injected into a local match line if a portion of the match line, which is searched first, does not match the corresponding portion of the comparand. Using a NOR/NOR type of search, embodiments of the present invention are capable of reducing the current injected into the local match lines of the CAM during search operations by as much as 75%.

Figure 14:
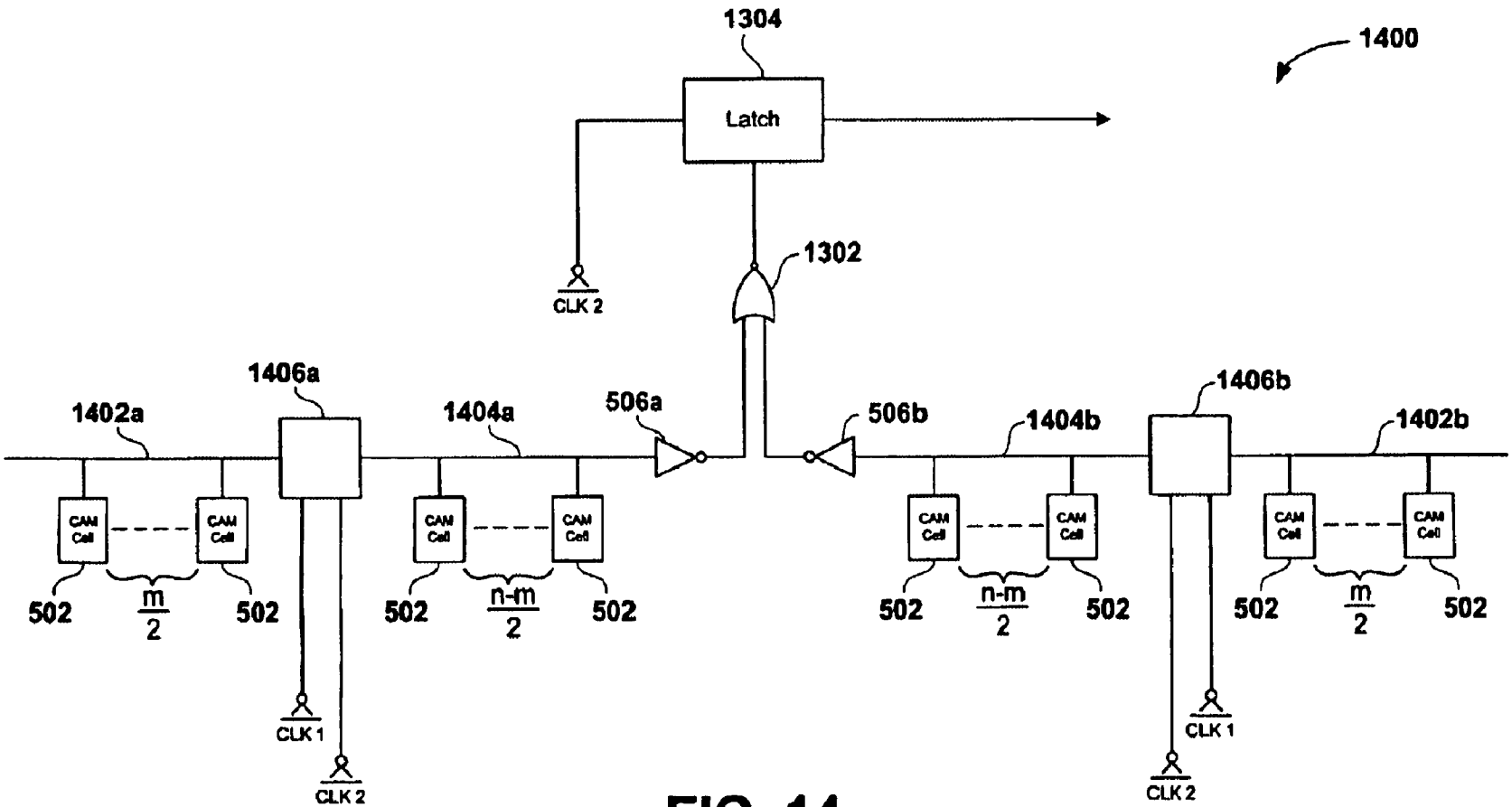
FIG. 14 is schematic diagram of a bit pattern entry configured for a NOR/NOR type search, in accordance with an embodiment of the present invention.

FIG. 14 is schematic diagram of a bit pattern entry 1400 configured for a NOR/NOR type search, in accordance with an embodiment of the present invention. The bit pattern entry 1400 includes a plurality of CAM cells 502 coupled to a match line comprised of two sample match lines 1402a and 1402b, and two sub-match lines 1404a and 1404b. Sample match line 1402a is coupled to the sub-match line 1404a via sample circuit 1406a. Similarly, sample match line 1402b is coupled to the sub-match line 1404b via sample circuit 1406b. The sub-match lines 1404a and 1404b are coupled to inverters 506a and 506b, respectively, which are coupled to a NOR gate 1302. The output of the NOR gate is provided to a latch 1304, which latches the output of bit pattern entry.

In the following description n is the total number of CAM cells 502 comprising the bit pattern entry 1400. In addition, m is the total number of CAM cells 502 coupled to the sample match lines 1402a and 1402b. Thus, m/2 is the number of CAM cells 502 coupled to each sample match line 1402a and 1402b. Similarly, (n−m)/2 is the number of CAM cells 502 coupled to each sub-match line 1404a and 1404b. Further, m is much smaller than n (m<<n).

During a search operation, the NOR/NOR bit pattern entry 1400 first compares the search data with the CAM cells 502 coupled to the sample match lines 1402a and 1402b. As in the embodiments discussed previously, if a particular CAM cell 502 does not match the search data, the CAM cell 502 will pull the sample match line 1402a or 1402b low. Otherwise, the sample match line 1402a or 1402b will remain high.

The results of the comparison with the sample match lines 1402a and 1402b are then provided to the sample circuits 1406a and 1406b, respectively. Each of the sample circuits 1406a and 1406b determine whether a hit occurred on the sample match line 1402a/1402b coupled to the sample circuit 1406a/1406b. Searches will then occur only on sub-match lines 1404a and 1404b wherein a hit occurred on the sample match line 1402a and 1402b, respectively. Specifically, if the sample match line 1402a is high, the sample circuit 1406a injects current into the sub-match line 1404a, thus allowing the CAM cells 502 coupled to the sub-match line 1404a to be compared to the search data. Otherwise, the sample circuit 1406a does not inject current into the sub-match line 1404a, thus avoiding a search of the CAM cells 502 coupled to the sub-match line 1404a. Sample circuit 1406b performs in a similar manner to sample match line 1402a and sub-match line 1404b as does sample circuit 1406a.

The sub-match lines 1404a and 1404b will only remain high when both their respective sample match lines 1402a and 1402b are high, and the CAM cells 502 coupled to the sub-match lines 1404a and 1404b match the remaining search data. The signals from each sub-match line 1404a and 1404b are then combined using the NOR gate 1302. The NOR gate 1302 ensures that the signal provided to the latch 1304 will be high only when both sub-match lines 1404a and 1404b are high. If either sub-match line 1404a or 1404b is pulled low, the signal provided to the latch 1304 will be low. The latch 1304 then latches the match line output until the next active search.

To separate the search operations on the sample match lines 1402a and 1402b and the sub-match lines 1404a and 1404b, two internal clocks are used. The first internal clock /CLK1 manages the active search of the sample match lines 1402a and 1402b, and the second internal clock /CLK2 manages the active search of the sub-match lines 1404a and 1404b as well as the latch 1304. Since the sample match lines 1402a and 1402b are coupled to far less CAM cells 502 than are the sub-match lines 1404a and 1404b, the sample match lines 1402a and 1402b are generally much shorter than the sub-match lines 1404a and 1404b. As a result, less current is required to perform a search operation using the sample match lines 1402a and 1402b than is required when using the sub-match lines 1404a and 1404b. Thus, the first internal clock /CLK1 pulse is of a shorter duration than the second internal clock /CLK2 pulse. In addition, the embodiment shown in FIG. 14 shows the first and second clocks /CLK1 and /CLK2 as inverted clocks. However, it should be noted that other types of clocks can be used in the embodiments of the present invention, as will be apparent to those skilled in the art.

Figure 15:
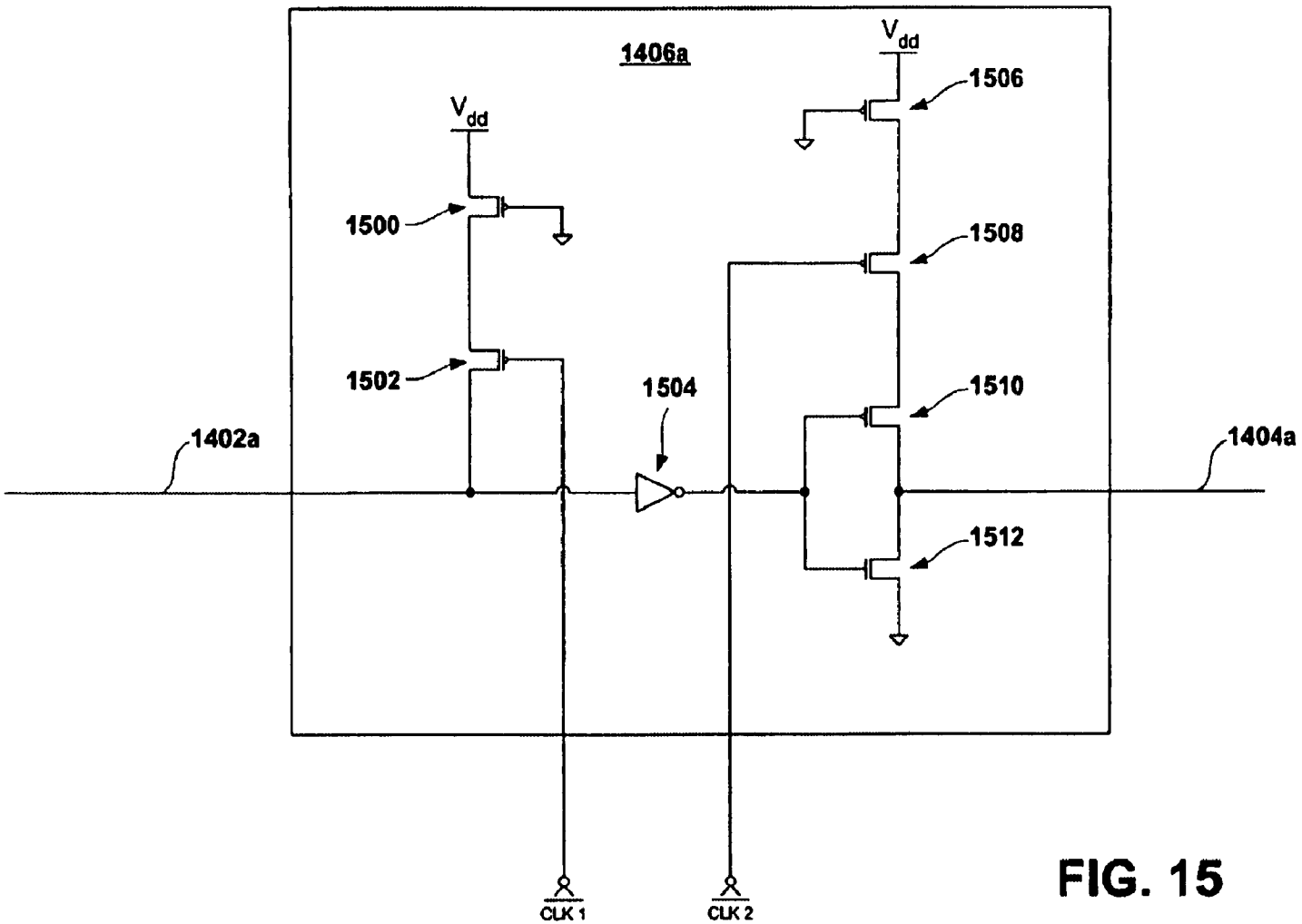
FIG. 15 is a schematic diagram showing a sample circuit, in accordance with an embodiment of the present invention.

FIG. 15 is a schematic diagram showing the sample circuit 1406a, in accordance with an embodiment of the present invention. The sample circuit 1406a includes a p-channel transistor 1500 having a gate coupled to ground, a first terminal coupled to $V_{dd}$ and a second terminal coupled to a first terminal of p-channel transistor 1502. The second terminal of transistor 1502 is coupled to sample match line 1402a, and the gate of transistor 1502 is coupled to the first internal clock /CLK1.

Further, sample match line 1402a is coupled to an inverter 1504, which is also coupled to the gates of p-channel transistor 1510 and n-channel transistor 1512. One terminal of transistor 1512 is coupled to ground, and the other terminal is coupled to both the sub-match line 1404a and a terminal of transistor 1510. The other terminal of transistor 1510 is coupled to a first terminal p-channel transistor 1508. The gate of transistor 1508 is coupled to the second internal clock /CLK2 and the second terminal of transistor 1508 is coupled to a terminal of p-channel transistor 1506. The other terminal of transistor 1506 is coupled to $V_{dd}$ and the gate of transistor 1506 is coupled to ground. It should be noted that although only sample circuit 1406a is illustrated in FIG. 15, sample circuit 1406b is configured in a similar manner so as to couple sample match line 1402b and sub-match line 1404b.

In operation, transistors 1500 and 1502 provide current to the sample match line 1402a during the clock pulses of the first internal clock /CLK1. At this point, the searched data is provided to the CAM cells coupled to the sample match line 1402a. If any of these CAM cells do not match the search data for its cell, the sample match line 1402a is pulled low. Otherwise, the sample match line 1402a maintains the charge provided by transistors 1500 and 1502. The inverter 1504 then inverts the search result on sample match line 1402a and provides the inverted result to the gates of transistors 1510 and 1512.

Depending on the state of the sample match line 1402a, transistors 1506 and 1508 may or may not provide current to the submatch line 1404a during the clock pulses of the second internal clock /CLK2. Specifically, when the sample match line 1402a is high the inverter 1504 provides an inverted sample match line, which is low, to the gates of transistors 1510 and 1512. In this case, the low voltage at the gate of transistor 1510 will turn transistor 1510 on, thus providing current to the sub-match line 1404a during the next pulse of the second internal clock /CLK2. Conversely, when the sample match line 1402a is low the inverter 1504 provides an inverted sample match line, which is high, to the gates of transistors 1510 and 1512. In this case, the high voltage at the gate of transistor 1510 will turn transistor 1510 off, thus preventing current from flowing to the sub-match line 1404a. In addition, the high voltage at the gate of transistor 1512 will turn transistor 1512 on, thus pulling the sub-match line 1404a low by grounding the sub-match line 1404a. In this manner, whenever the sample match line 1402a is pulled low, the sub-match line 1404a will also be pulled low. However, when the sample match line 1402a is high, current will be injected into the sub-match line 1404a to complete the search operation by comparing the search data with the CAM cells coupled to the sub-match line 1404a.

Figure 16:
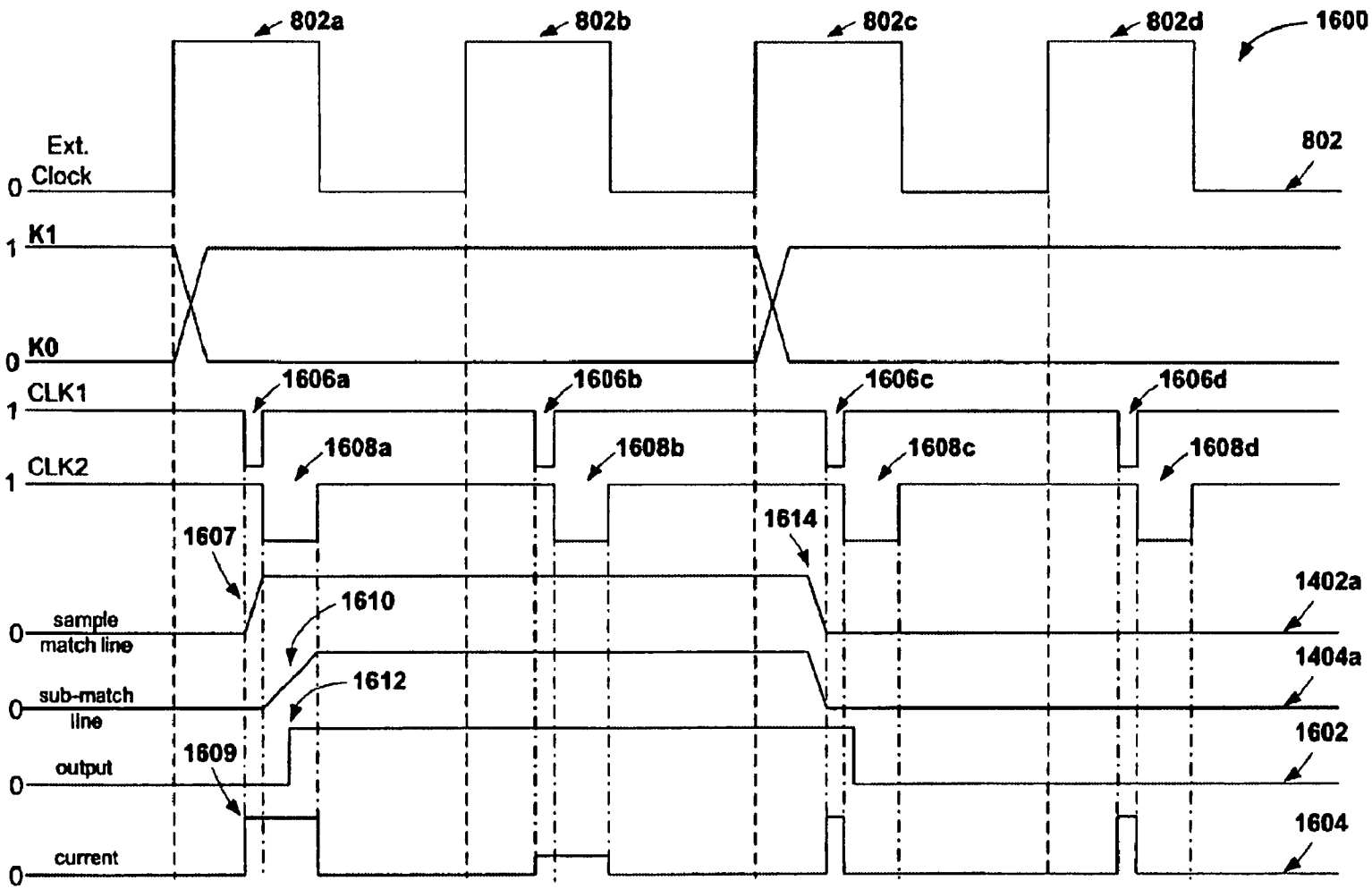
FIG. 16 is a diagram showing exemplary search signals for bit pattern entry configured for a NOR/NOR type search, in accordance with an embodiment of the present invention.

FIG. 16 is a diagram showing exemplary search signals 1600 for a bit pattern entry that is configured for a NOR/NOR type search, in accordance with an embodiment of the present invention. The exemplary search signals 1600 include the external clock 802, compare lines K0 and K1, the first internal clock /CLK1, the second internal clock /CLK2, the sample match line 1402a, the sub-match line 1404a, output 1602, and current 1604. As will be seen, embodiments of the present invention reduce the amount of power utilized during searches by testing a small portion of a particular bit pattern to determine if there is a potential match. If so, the rest of the bit pattern is tested to determine if a match exist. If the sample does not match, power is not wasted testing the remainder of the bit pattern.

In the example of FIG. 16, the comparand matches the bit pattern entry for the first and second external clock cycles 802a and 802b, and does not match the bit pattern entry for the third and fourth external clock cycles 802c and 802d. In particular, the sample portion of the bit pattern entry does not match the corresponding portion of the comparand during the third and fourth external clock cycles 802c and 802d. As will be explained in greater detail below, current is not injected into the sub-match line 1404a when the sample portion of the bit pattern entry misses, thus conserving power during the third and fourth external clock cycles 802c and 802d.

During the first external clock cycle 802a the comparand is loaded on the compare lines for the bit pattern entry. When the compare lines are charged, the first pulse 1606a of the first internal clock /CLK1 occurs. During the first internal pulse 1606a of the first internal clock (CLK1, current is injected into the sample match line 1402a, as shown at point 1607. The current is also reflected in the current graph 1604 at point 1609. As discussed above, the comparand matches the bit pattern entry during the first external clock cycle 802a. Accordingly, the sample CAM cells coupled to the sample match line 1404a match the corresponding portions of the comparand. As a result, the current in the sample match line rises at point 1607.

Following the first internal clock pulse 1606a, the first pulse 1608a of the second internal clock /CLK2 occurs. As mentioned above, the embodiments of the present invention inject current into the sub-match line 1404a when the sample match line 1402a matches a corresponding sample of the comparand. Thus, during the first clock pulse 1608a of the second internal clock /CLK2, current is injected into the sub-match line at point 1610. As the sub-match line 1404a ramps up during the first pulse 1608a of the second internal clock /CLK2, the inverter, NOR gate, and latch coupled to the submatch line transition the output 1602 from low to high, at point 1612.

Since in this example the comparand remains the same during the second external clock cycle 802b, the data stored in the bit pattern entry will again match the comparand during the second external clock cycle 802b. Thus, during the second pulse 1606b of the first internal clock /CLK1, the sample match line 1402a is again injected with current from the current generator.

Unlike a conventional CAM, which precharges the match line to zero prior to each active search, embodiments of the present invention do not automatically discharge the match lines between active searches. Thus, if a match line is high as a result of a match during the previous clock cycle, the match line will remain high at the leading edge of the subsequent clock cycle if the comparand continues to match the data stored in the bit pattern entry. For this reason, the current injected in the sample match line is reduced.

Moreover, since the output 1602 follows the sub-match line 1404a, the output 1602 remains high for the duration of the first and second pulses of the first and second internal clock cycles 1606a/1606b and 1608a/1608b. More specifically, during the consecutive matches occurring in the first and second external clock cycles 802a and 802b, the voltage of the match lines 1402a and 1404a remains at a high level, thus continuously driving the output 1602 of the bit pattern entry high for the first and second clock cycles.

Figure 17:
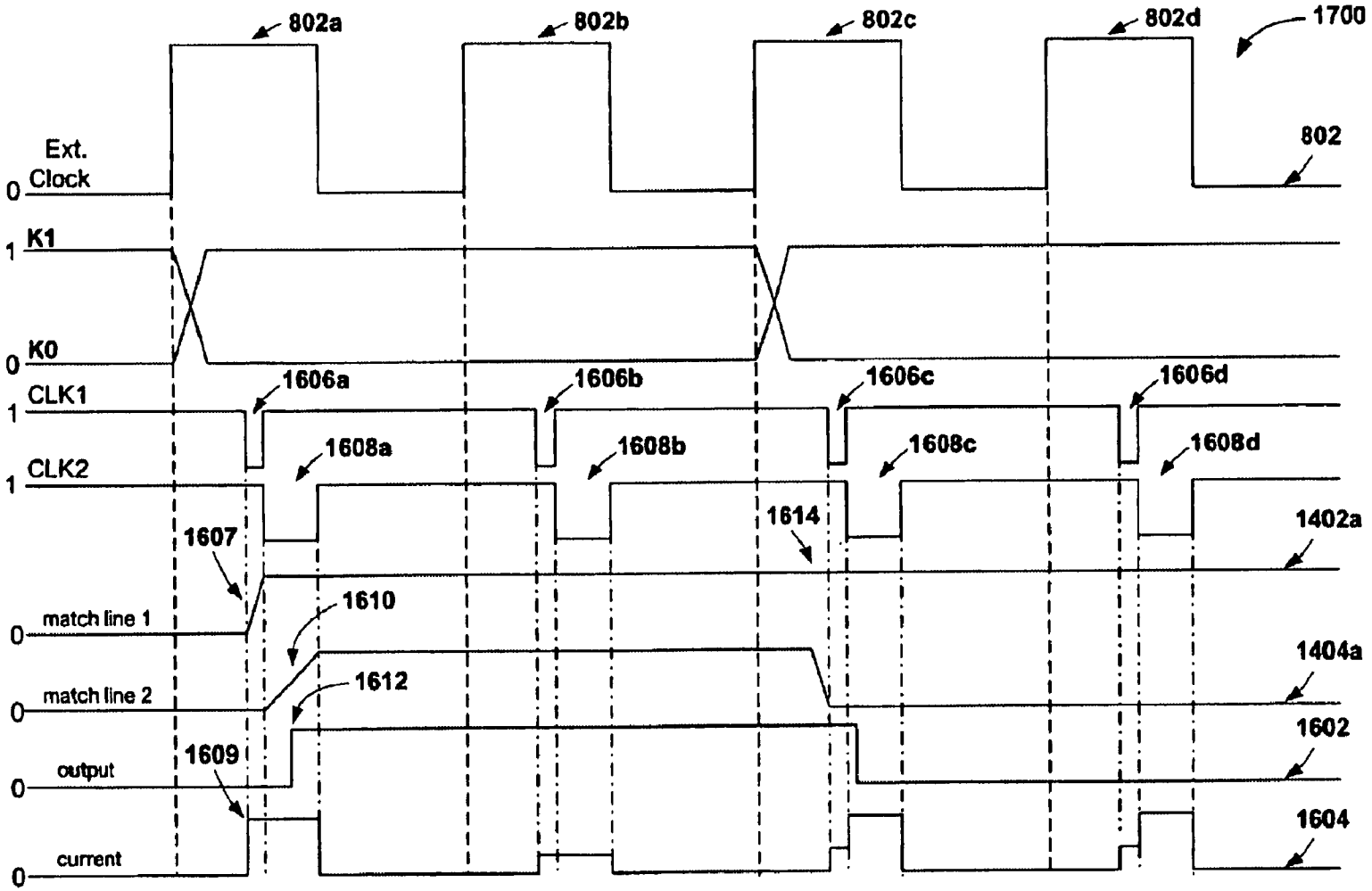
FIG. 17 is a diagram showing exemplary search signals for bit pattern entry configured for a NOR/NOR type search, in accordance with an embodiment of the present invention.

The comparand changes during the third external clock cycle 802c, and thus no longer matches the data stored in the bit pattern entry during this clock cycle. Further, in the example of FIG. 16, the sample portion of the bit pattern no longer matches the corresponding sample bits of the comparand. FIG. 17, discussed later, will illustrate a case wherein the sample portion of the bit pattern matches while the remaining portion of the bit pattern does not match.

Referring back to FIG. 16, during the third pulse 1606c of the first internal clock /CLK1, current is again injected into the sample match line 1402a. However, because the sample portion of the comparand does not match the sample portion of the bit pattern coupled to the sample match line 1402a, the sample match line 1402a is pulled low, at point 1614. Then, during the third pulse 1608c of the second internal clock /CLK2, current is not injected into the sub-match line 1404a since the sample match line 1402a is low. As mentioned above, when the sample match line 1402a is low, current from the current generator is blocked from reaching the sub-match line 1404a by transistor 1510. Moreover, transistor 1512 turns on and pulls the sub-match line 1404a low when the sample match line is low. As a result, during the third pulse 1608c of the second internal clock /CLK2, the output 1602 goes low when the voltage of the sub-match line 1404a reaches a level that is too low to drive the output 1602 high.

As shown in the current graph 1604, the current used during the third external lock cycle 802c is much less than that used during the first and second external clock cycles 802a and 802b. This results from the sample match line 1402a being smaller than the entire match line, thus requiring less current. Hence, current is only injected during the pulses of the first internal clock /CLK1. During the third pulse 1608c of the second internal clock /CLK2, current is not injected into the sub-match line 1404a, as shown in the current graph 1604. In addition, since the comparand also does not match the data stored in the bit pattern entry in the fourth external clock cycle 802d, the non-matching CAM cells again pull the sample match line 1402a low. As a result, the sub-match line 1404a and the output 1602 remain low during the fourth pulse 1608d of the second internal clock /CLK2.

FIG. 17 is a diagram showing exemplary search signals 1700 for bit pattern entry configured for a NOR/NOR type search, in accordance with an embodiment of the present invention. Similar to FIG. 16, the exemplary search signals 1700 of FIG. 17 include the external clock 802, compare lines K0 and K1, the first internal clock /CLK1, the second internal clock /CLK2, the sample match line 1402a, the submatch line 1404a, output 1602, and current 1604.

In the example of FIG. 17, the comparand matches the bit pattern entry for the first and second external clock cycles 802a and 802b, and does not match the bit pattern entry for the third and fourth external clock cycles 802c and 802d. In particular, the sample portion of the bit pattern entry matches the corresponding portion of the comparand during the third and fourth external clock cycles 802c and 802d, however, the remaining portion of the bit pattern entry does not match the comparand.

During the first external clock cycle 802a the comparand is loaded on the compare lines for the bit pattern entry. When the compare lines are charged, the first pulse 1606a of the first internal clock /CLK1 occurs. As previously mentioned, the internal clocks /CLK1 and /CLK2 are inverted clocks. During the first internal pulse 1606a of the first internal clock /CLK1, current is injected into the sample match line 1402a, as shown at point 1607. The current is also reflected in the current graph 1604 at point 1609. As discussed above, the comparand matches the bit pattern entry during the first external clock cycle 802a. Accordingly, the sample CAM cells coupled to the sample match line 1404a match the corresponding portions of the comparand. As a result, the current in the sample match line rises at point 1607.

The second internal clock then follows the first internal clock, and thus the first pulse 1608a of the second internal clock /CLK2 occurs. As mentioned above, the embodiments of the present invention inject current into the sub-match line 1404a when the sample match line 1402a matches a corresponding sample of the comparand. Thus, during the first clock pulse 1608a of the second internal clock /CLK2, current is injected into the sub-match line at point 1610. As the sub-match line 1404a ramps up during the first pulse 1608a of the second internal clock /CLK2, the inverter, NOR gate, and latch coupled to the sub-match line transition the output 1602 from low to high, at point 1612.

Since in this example the comparand remains the same during the second external clock cycle 802b, the data stored in the bit pattern entry will again match the comparand during the second external clock cycle 802b. Thus, during the second pulse 1606b of the first internal clock /CLK1, the sample match line 1402a is again injected with current from the current generator. However, this current is reduced since the sample match line 1402a was already in a high state.

Moreover, since the output 1602 follows the sub-match line 1404a, the output 1602 remains high for the duration of the first and second pulses of the first and second internal clock cycles 1606a/1606b and 1608a/1608b. More specifically, during the consecutive matches occurring in the first and second external clock cycles 802a and 802b, the voltage of the match lines 1402a and 1404a remains at a high level, thus continuously driving the output 1602 of the bit pattern entry high for the first and second clock cycles.

The comparand changes during the third external clock cycle 802c, and thus no longer matches the data stored in the bit pattern entry during this clock cycle. Further, in the example of FIG. 17, the sample portion of the bit pattern matches the corresponding sample bits of the comparand, while the remaining portion of the bit pattern does not match the comparand.

During the third pulse 1606c of the first internal clock /CLK1, current is again injected into the sample match line 1402a, which remains high because the sample portion of the bit pattern entry matches the corresponding sample portion of the comparand, as mentioned above. As a result, current is also injected into the sub-match line 1404a, which is pulled low because the remaining portion of the bit pattern entry, which is coupled to the sub-match line 1404a, does not match the remaining portion of the comparand. Hence, during the third pulse 1608c of the second internal clock /CLK2, current is injected into the submatch line 1404a, but the sub-match line 1404a is still pulled low.

As mentioned above, when the sample match line 1402a is high, current from the current generator is injected into the sub-match line 1404a by transistor 1510. However, since the remaining portion of the bit pattern entry does not match the remaining portion of the comparand, the CAM cells pull the sub-match line 1404a low. As a result, during the third pulse 1608c of the second internal clock /CLK2, the output 1602 goes low when the voltage of the sub-match line 1404a reaches a level that is too low to drive the output 1102 high. In addition, since the comparand also does not match the data stored in the bit pattern entry in the fourth external clock cycle 802d, the non-matching CAM cells again pull the sub-match line 1404a low. As a result, the sub-match line 1404a and the output 1602 remain low during the fourth pulse 1608d of the second internal clock /CLK2.

Advantageously, embodiments of the present invention reduce the amount of power required in the CAM during search operations by injecting less current into the match lines of bit pattern entries that do not match the comparand. More specifically, when the sample portion of the match line does not match the corresponding sample of the comparand, current is only injected during the first internal clock /CLK1. In addition, by properly choosing bit positions through out the bit pattern entry, the sample portion of the bit pattern entry can be made to have a high probability of missing. In one embodiment, the actual bits included in the sample portion of the bit pattern entry are randomly chosen. In other embodiments, statistics can be used to choose particular bits to include in the sample portion of the bit pattern entry. In all embodiments, corresponding sample bits in the comparand are compared to the selected sample bits in the sample portion of the bit pattern entry.

Figure 18:
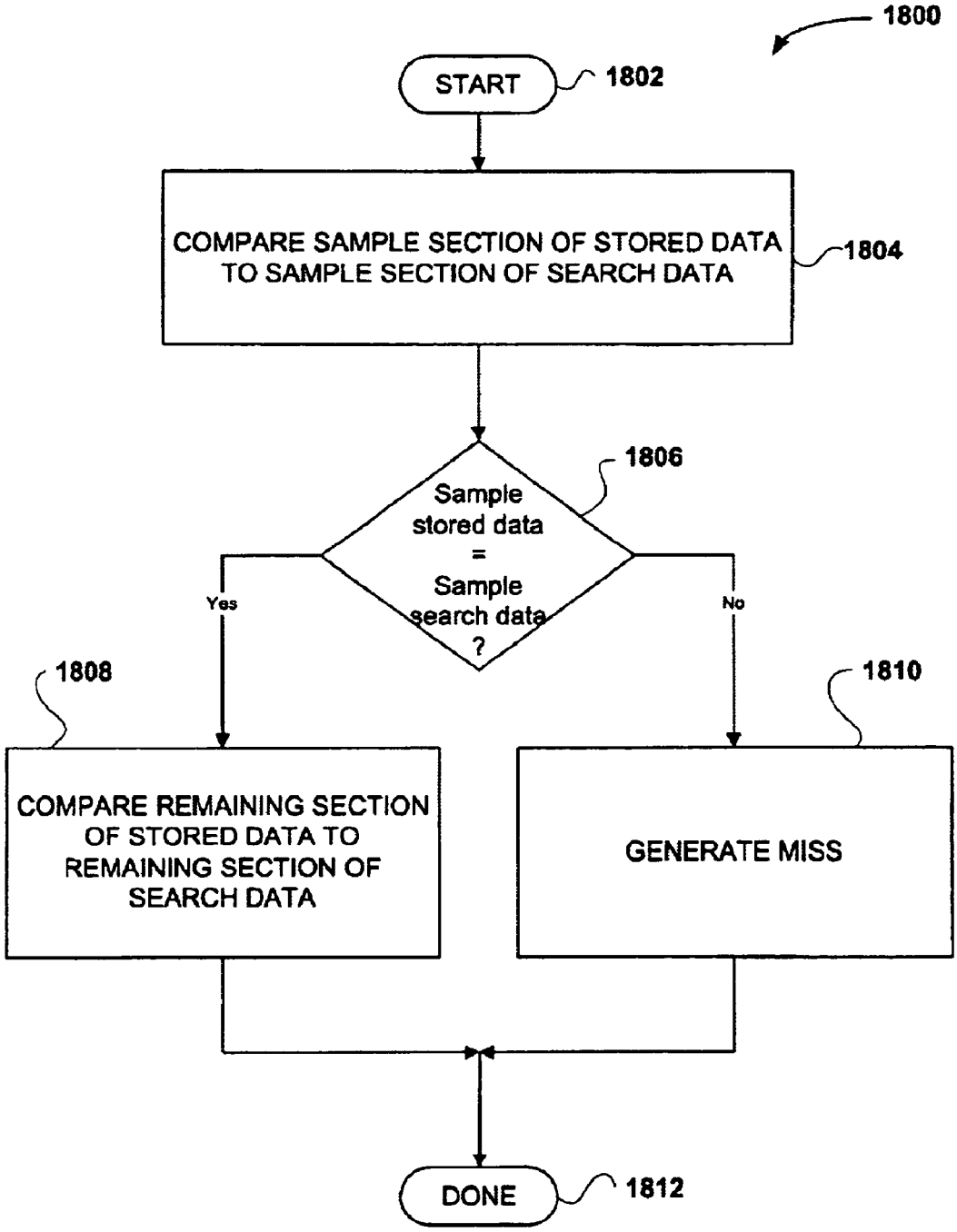
FIG. 18 is a flowchart showing a method for reducing power in a CAM during search operations using sample match lines, in accordance with an embodiment of the present invention.

FIG. 18 is a flowchart showing a method 1800 for reducing power in a CAM during search operations using sample match lines, in accordance with an embodiment of the present invention. In an initial operation 1802, preprocess operations are performed. Preprocess operations include configuring the CAM, receiving a comparand from the search port, and other preprocess operations that will be apparent to those skilled in the art.

In operation 1804, a sample section of stored data is compared to a sample section of the search data. Generally, the bit pattern entry of the present invention includes a plurality of CAM cells coupled to a match line comprised of two sample match lines, and two sub-match lines. The sub-match lines are coupled to inverters, which are coupled to a NOR gate. The output of the NOR gate is provided to a latch, which latches the output of the bit pattern entry.

During a search operation, the NOR/NOR bit pattern entry first compares the search data with the CAM cells coupled to the sample match lines. In the following description n is the total number of CAM cells comprising the bit pattern entry. In addition, m is the total number of CAM cells coupled to the sample match lines 1402a and 1402b. Thus, m/2 is the number of CAM cells coupled to each sample match line 1402a and 1402b. Similarly, (n−m)/2 is the number of CAM cells coupled to each sub-match line. Further, m is smaller than n, and preferably, m is much smaller than n (m<<n).

A determination is then made as to whether the sample stored data matches the sample search data, in operation 1806. If the sample stored data matches the sample search data, the method 1800 branches to operation 1808. Otherwise, the method 1800 branches to operation 1810.

The remaining section of the stored data is compared to the remaining section of the search data if the sample stored data matches the sample search data, in operation 1808. The results of the comparison with the sample match lines are provided to sample circuits after the sample comparison operation 1804. Each of the sample circuits determine whether a hit occurred on the sample match line that is coupled to the sample circuit. Searches then occur only on sub-match lines wherein a hit occurred on the related sample match line. Specifically, if the sample match line is high, the sample circuit injects current into the corresponding sub-match line, thus allowing the CAM cells coupled to the sub-match line to be compared to the search data.

A miss is generated, in operation 1810 if the sample stored data does not match the sample search data. If a sample match line is low, the sample circuit does not inject current into the sub-match line, thus avoiding a search of the CAM cells coupled to the sub-match line. Thus, the submatch lines will only remain high when both their respective sample match lines are high, and when the remaining portion of the search data matches the remaining portion of the bit pattern entry. The values from each sub-match line are then combined using a NOR gate. The NOR gate ensures that the signal provided to the latch will be high only when both sub-match lines are high. If either submatch line is pulled low by a non-matching CAM cell, the signal provided to the latch will be low. The latch then latches the match line output until the next active search.

Post process operations are performed in operation 1812. Post process operations include CAM maintenance, hit prioritizing, and other post-process operations that will be apparent to those skilled in the art. Advantageously, embodiments of the present invention reduce the amount of power required in the CAM during search operations by injecting less current into the match lines of bit pattern entries that do not match the comparand. Further, by properly choosing bit positions through out the bit pattern entry, the sample portion of the bit pattern entry can be made to have a high probability of missing.

Power Savings in Compare Lines—NOR/NOR Type Search

In addition to using sample words to reduce power usage in match lines, embodiments of the present invention can also utilize sample words to reduce power usage in compare lines. Broadly speaking, the results of sample searches on multiple rows are utilized to gate the propagation of search data on the compare lines that correspond to the rest of the word. If a "miss" results from all the sample words in a group of sample words on multiple rows, the search data is not propagated to the corresponding compare lines for the remainder of the word on each row of the group, thus saving power on those compare lines.

As mentioned above, conventional CAMs capture search data on the positive edge of the external clock and propagate the data to the compare lines. The load on the compare lines is significant and, as such, so is the power required to toggle them. Hence, embodiments of the present invention utilize sample words to test compare results before propagating the search data to the remainder of the word. In one embodiment, the compare lines are separated into global compare lines and local compare lines, running in parallel. The local compare lines are coupled to the inputs of the XOR gates within the CAM core cells, while the global compare lines are not coupled to the inputs of the XOR gates within the CAM core cells, as illustrated in FIG. 25.

Figure 25:
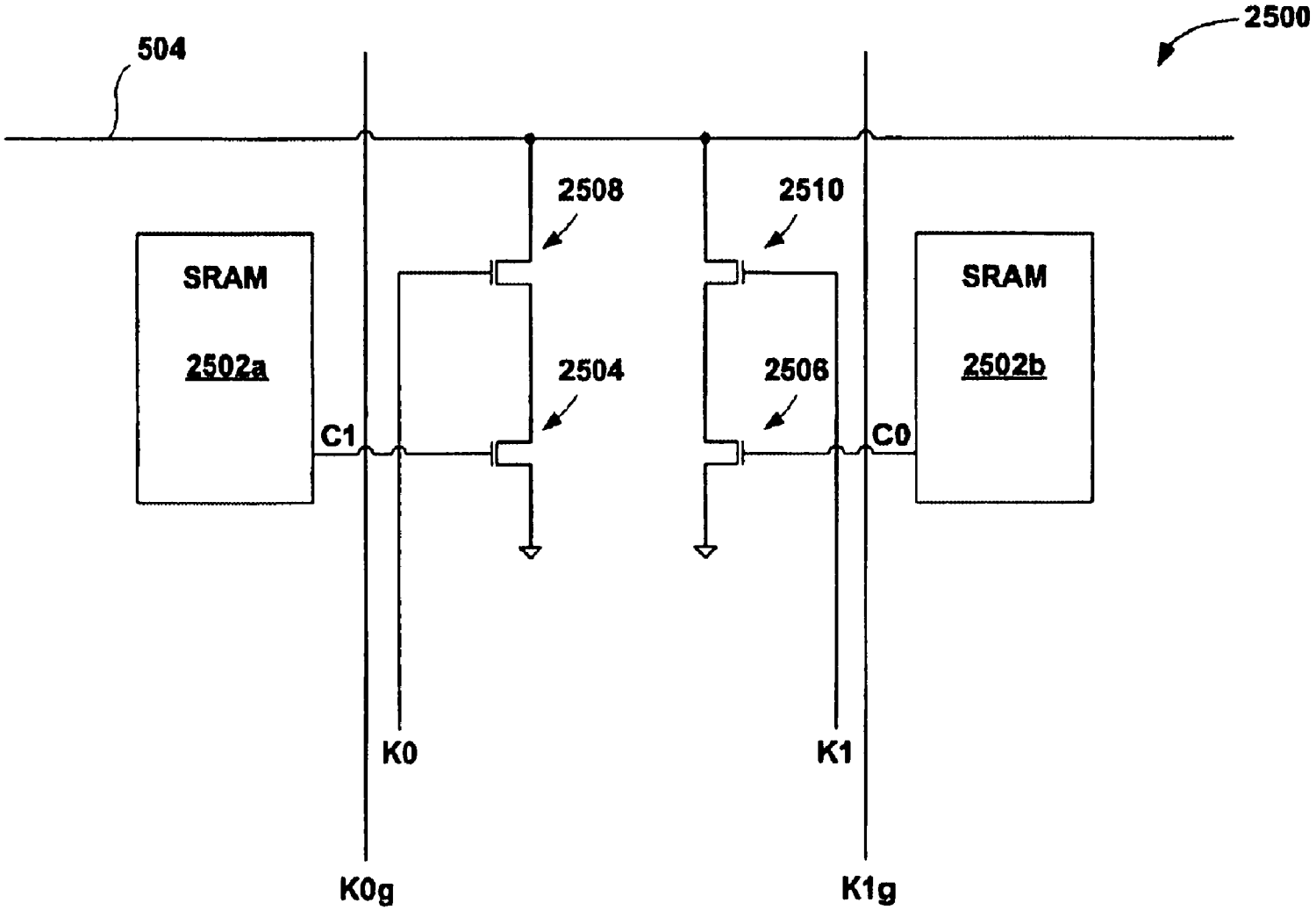
FIG. 25 is a schematic diagram showing a ternary CAM cell and its relation to local compare lines and global compare lines, in accordance with an embodiment of the present invention.

FIG. 25 is a schematic diagram showing a ternary CAM cell 2500 and its relation to local compare lines and global compare lines, in accordance with an embodiment of the present invention. The ternary CAM cell 2500 includes pair of storage elements 2502a and 2502b, which can comprise any type of storage element capable of storing a binary value, such as an SRAM. The output c1 of storage element 2502a is coupled to the gate of transistor 2504, while the output c0 of storage element 2502b is coupled to the gate of transistor 2506. A first local compare line K0 is coupled to the gate of transistor 2508, and a second local compare line K1 is coupled to the gate of transistor 2510.

The local compare lines K0 and K1 are spread over a number of q rows. For example, one exemplary value for q can be 256. Also shown in FIG. 25 are global compare lines K0g and K1g. Each global compare line K0g and K1g spread over the entire height of the core. The global compare lines K0g and K1g are utilized to generate the local compare lines K0 and K1, as illustrated in FIG. 26.

Figure 26:
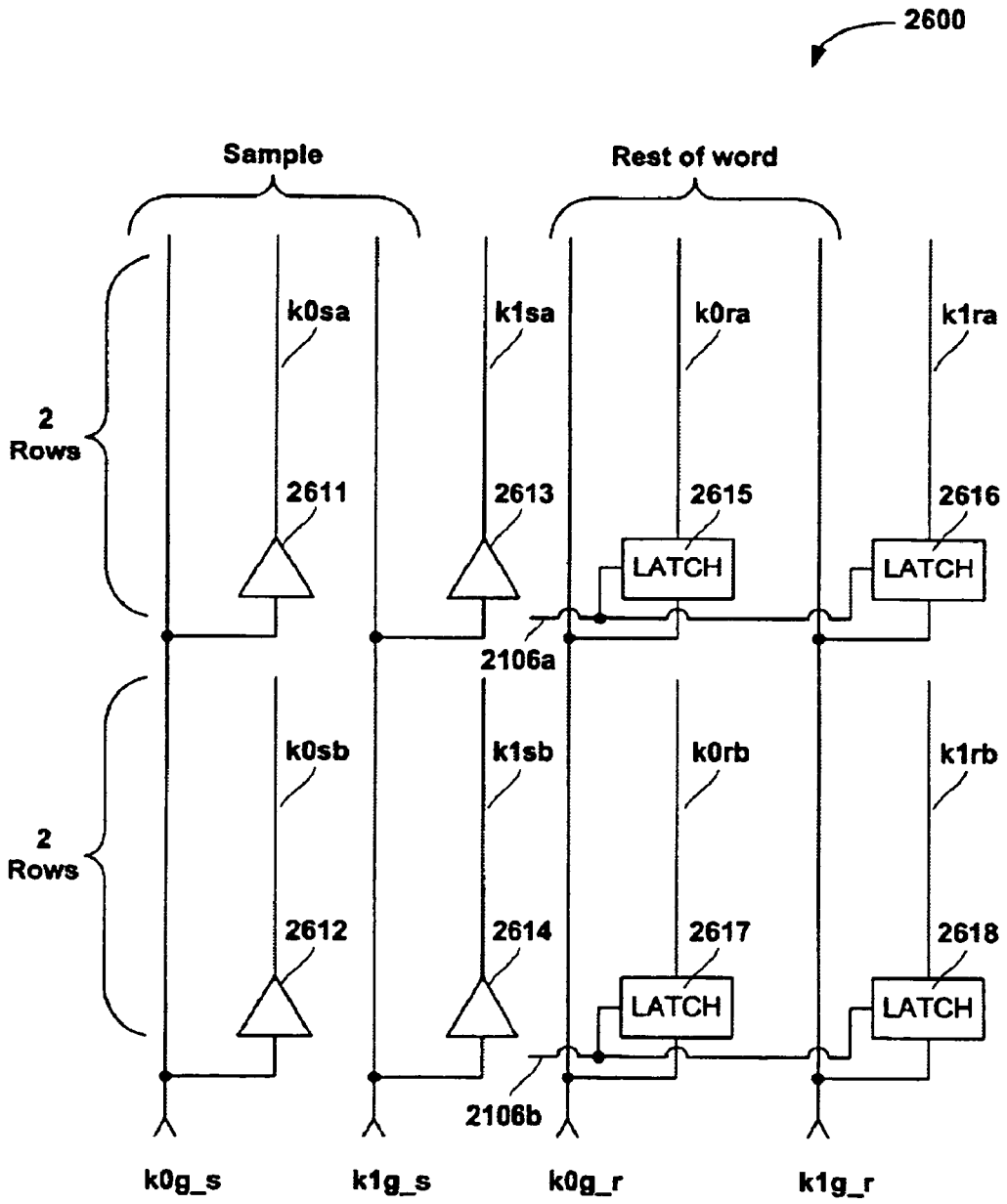
FIG. 26 is a schematic diagram showing the relationship between local compare lines and global compare lines, in accordance with an embodiment of the present invention.

FIG. 26 is a schematic diagram showing the relationship between local compare lines and global compare lines, in accordance with an embodiment of the present invention. FIG. 26 illustrates how the local compare lines are generated from the global compare lines. The global compare lines include sample global compare lines [K0g_s *and* K1g_s] *K0g_s and K1_s*, which generated local compare lines for the sample words, and remainder global compare lines K0g_r and K1g_r, which generated local compare lines for the remainder of the word.

Figure 21:
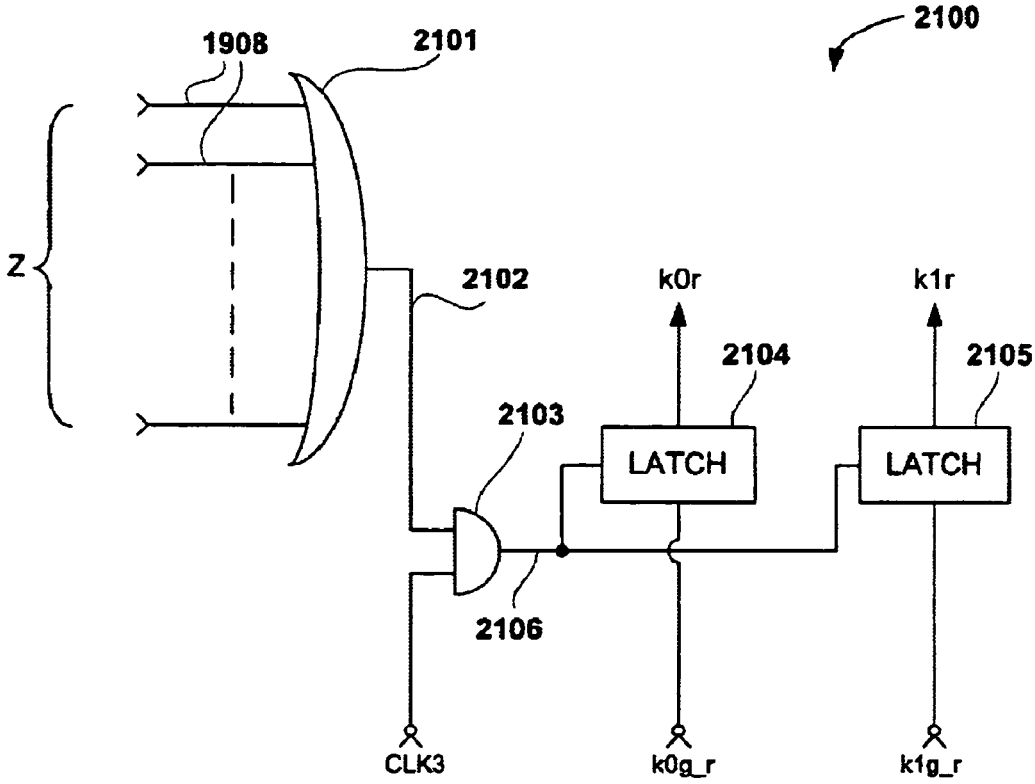
FIG. 21 is a schematic diagram showing a compare line propagation control circuit, in accordance with an embodiment of the present invention.

More particularly, the sample global compare lines K0g_s and K1g_s are buffered every q rows, using buffers 2611, 2612, 2613, and 2614. The outputs of the buffers 2611, 2612, 2613, and 2614 generate the sample local compare lines K0sa, K0sb, K1sa, and K1sb, which are utilized to search the sample words. The remainder global compare lines K0g_r and K1g_r are latched every q rows using latches 2615, 2616, 2617, and 2618. The outputs of the latches 2615, 2616, 2617, and 2618 generate the remainder local compare lines K0ra, K0rb, K1ra, and K1rb, which are utilized to search the remainder of the word. The latches 2615, 2616, 2617, and 2618 are controlled by clock signals 2106a and 2106b, which are generated as illustrated in FIG. 21, discussed in greater detail below.

Figure 19:
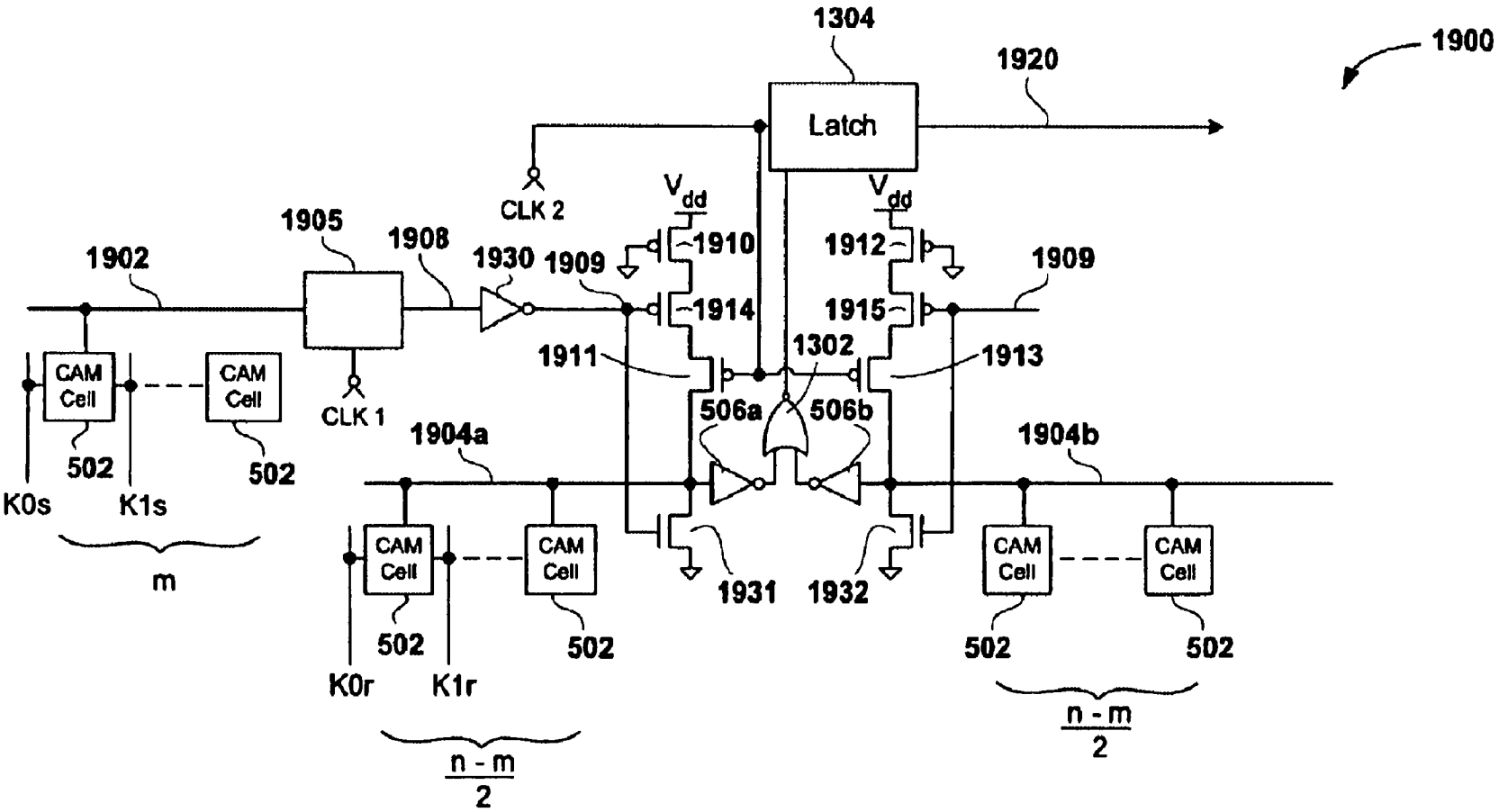
FIG. 19 is a schematic diagram showing a bit pattern entry configured for a low power compare line search, in accordance with an embodiment of the present invention.

FIG. 19 is a schematic diagram showing a bit pattern entry 1900 configured for a low power compare line search, in accordance with an embodiment of the present invention. As will be explained subsequently, the bit pattern 1900 is configured to save power on the compare lines by allowing the local compare lines corresponding to the remainder of the word to toggle only when necessary. The bit pattern entry 1900 includes a sample local match line 1902, which is the local match line for the sample word of the bit pattern entry 1900. As shown in FIG. 19, a number m of CAM cells 502 are coupled to the sample local match line 1902. Coupled to each CAM cell 502 of the sample word, are sample local compare lines K0s and K1s.

The bit pattern entry 1900 also includes a match sense circuit 1905, which receives the sample local match line 1902 and a first clock signal CLK1 as inputs. The match sense circuit 1905 generates a sample match signal 1908 as an output, which is utilized as an input to a sample group OR gate, discussed in greater detail below with reference to FIG. 21. The remainder of the bit pattern entry 1900 includes sub-match lines 1904a and 1904b, which are the local match lines for the remainder of the word. Similar to above, a number (n−m)/2 of CAM cells 502 are coupled to each sub-match line 1904a and 1904b. Coupled to each CAM cell 502 of the remainder of the word, are remainder local compare lines K0r and K1r. For example, in one embodiment of the present invention, possible values for n, m, and q can be n=36 m=12 and q=256. In this manner, the probability of a logic value of 1 on the sample match signal 1908 generally is relatively low.

Transistors 1910 and 1912 function as current generators for the sub-match lines 1904a and 1904b. As shown in FIG. 16, a second clock signal CLK2 controls the current injected into the sub-match lines 1904a and 1904b via transistors 1911 and 1913. In addition, the sample match signal 1908 is inverted, by inverter 1930, to generate a signal 1909, which gates the current injected into the sub-match lines 1904a and 1904b via transistors 1914 and 1915.

As can be appreciated, if the local match signal 1908 is a logic 0, then signal 1909 will be a logic 1 because of inverter 1930. The logic 1 on signal 1909 turns OFF transistors 1914 and 1925, and turns ON transistors 1931 and 1932, which pulls the submatch lines 1904a and 1904b to logic 0 via transistors 1931 and 1932. Thus, if the sample word search is a "miss," the local match signal 1908 will be logic 0 and the submatch lines 1904a and 1904b will be pulled to logic 0 indicating a "miss."

The sub-match lines 1904a and 1904b are used as inputs to inverters 506a and 506b, which function as match sense amplifiers. The outputs of inverters 506a and 506b are provided as inputs to NOR gate 1302, the output of which is provided to the latch 1304. Thus, if both the sub-match lines 1904a and 1904b have a logic value of 1, then the latch 1304 will store a logic 1, which corresponds to a "hit" on the latch output 1920. The latch 1304 is controlled by the second clock signal CLK2, which is generated by the control block search. Waveformns for CLK2 will be discussed in greater detail below with reference to FIGS. 22 and 23.

Figure 20:
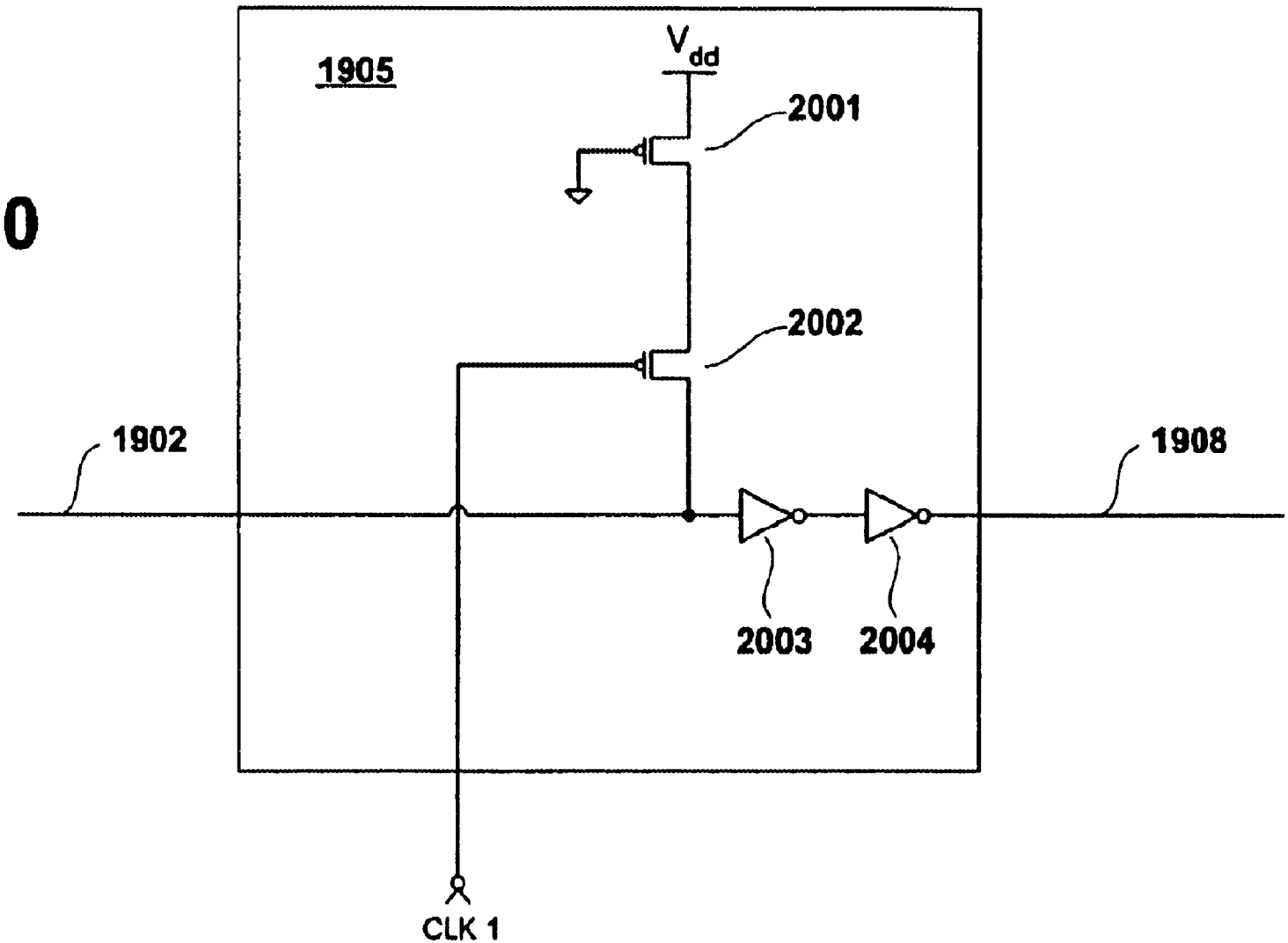
FIG. 20 is a schematic diagram showing an exemplary match sense circuit, in accordance with an embodiment of the present invention.

FIG. 20 is a schematic diagram showing an exemplary match sense circuit 1905, in accordance with an embodiment of the present invention. As illustrated, the match sense circuit 1905 includes a p-channel transistor 2001, which functions as a current generator, and includes a first terminal coupled to $V_{DD}$, a second terminal coupled to a terminal of transistor 2002, and a gate coupled to ground. The first clock signal CLK1 controls the current that is injected into the local match line 1902, via p-channel transistor 2002, which includes a first terminal coupled to transistor 2001, a second terminal coupled to the local match line 1902, and a gate coupled to the first clock signal CLK1. The clock CLK1 is generated via the control lock of the search.

The match sense circuit 1905 also includes an inverter 2003, which functions as a sense amplifier. The inverter 2003 includes an input coupled to the local match line 1902 and an output coupled to the input of inverter 2004, which inverts the output of the inverter 2003 to generate the local match signal 1908. As described next with reference to FIG. 21, the local match signal 1908 is grouped with a number q of local match signals 1908 from other rows to gate the propagation of search data on the compare lines that correspond to the rest of the word. If a "miss" results from all the sample words in a group of sample words on multiple rows, the search data is not propagated to the corresponding compare lines for the remainder of the word on each row of the group, thus saving power on those compare lines, as illustrated next with reference to FIG. 21.

FIG. 21 is a schematic diagram showing a compare line propagation control circuit 2100, in accordance with an embodiment of the present invention. The compare line propagation control circuit 2100 controls the propagation of the search data on the local compare lines corresponding to the remainder of the word. In particular, a plurality of sample match line signals 1908 from a number q rows are provided as inputs to a multiple input OR gate 2101 having q inputs. The sample match line signals 1908 are the sample search outputs [from the] for the sample word from a number of q bit pattern entries spread over q rows.

The output of the multiple input OR gate 2101 generates a match group signal 2102, which is provided as an input to an AND gate 2103 along with a third clock signal CLK3. The output of the AND gate 2103 provides a latch control signal 2106, which is utilized to control local compare line latches 2104 and 2105. As discussed above with reference to FIG. 26, the compare line latches 2104 and 2105 are utilized to allow the data from the remainder global compare lines K0g_r and K1g_r to propagate to the remainder local compare lines K0r and K1r. As can be appreciated, only if all the sample match signal 1908 inputs to the multiple input OR gate 2101 are logic 0, does the search data from the remainder global compare lines K0g_r and K1g_r not propagate to the remainder local compare lines K0r and K1r. Hence, if any sample match signal 1908 input to the multiple input OR gate 2101 is logic 1, the search data will propagate to the remainder local compare lines K0r and K1r.

Figure 22:
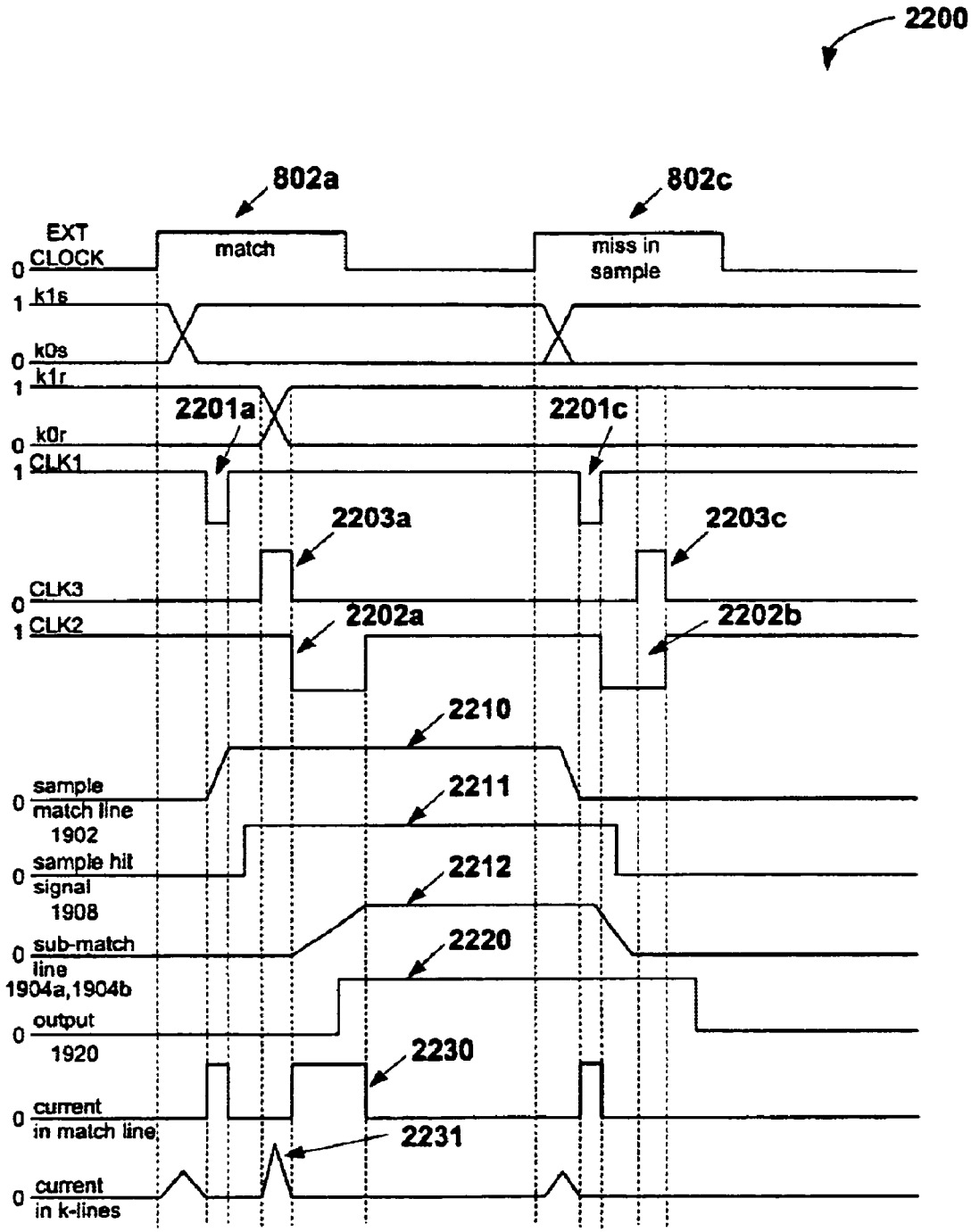
FIG. 22 is a diagram showing exemplary search signals for a bit pattern entry configured to save power on the compare lines during search operations, in accordance with an embodiment of the present invention.

FIG. 22 is a diagram showing exemplary search signals 2200 for a bit pattern entry configured to save power on the compare lines during search operations, in accordance with an embodiment of the present invention. FIG. 22 exemplifies two external clock cycles 802a ad 802c. In the first cycle 802a there is a match in both the sample word and in the remainder of the word of a bit pattern entry.

More particularly, during the first external clock cycle 802a, the comparand is loaded on the sample local compare lines K0s and K1s of the sample word. When the sample local compare lines K0s and K1s are charged, the first pulse of the internal clock CLK1 (2201a) occurs and a current is injected in the sample local match line 1902, which ramps up to logic 1 as shown by the waveform 2210. Since the sample word is a match, the sample match signal 1908 toggles to logic 1. When the pulse 2203a of CLK3 occurs the latch control signal 2106 switches to logic 1 and the latches 2104 and 2105 become transparent. As a result the remainder local compare lines K0r and K1r of the remainder of the word are loaded. After this, the pulse 2202a of the clock CLK2 occurs, injecting current in the sub-match lines 1904a and 1904b. Consequently, the sub-match lines 1904a and 1904b ramp up as shown by waveform 2212 making the latch output 1920 to switch to logic 1 signaling a match.

In the second external clock cycle 802c, a "miss" occurs in the sample part of the word for all the bit pattern entries spread over q rows. During the second cycle 802c of the external clock the comparand is loaded again on the sample local compare lines K0s and K1s. Since a "miss" occurs in the sample part of the word for all q rows, a "miss" is generated on the sample, making the sample match line 1902 ramp down. As a result, the sample match signal 1908 switches to logic 0 for all q rows. Because all q of the signals 1908 switch to logic 0, the latches 2104 and 2105 remain opaque and the remainder local compare lines K0r and K1r do not toggle. Consequently, power is saved on the compare lines.

The sub-match lines 1904a and 1904b are also brought down to logic 0, as is the latch output 1920 signaling a "miss." A waveform showing the current in the k lines has a pulse 2231 in the first external clock cycle 802a. However, the pulse is not repeated in the second external clock cycle 802b, when the "miss" occurred, illustrating the power savings provided by the embodiments of the present invention. A waveform showing the current in the match lines illustrates the savings in the local match lines, as described above.

Figure 23:
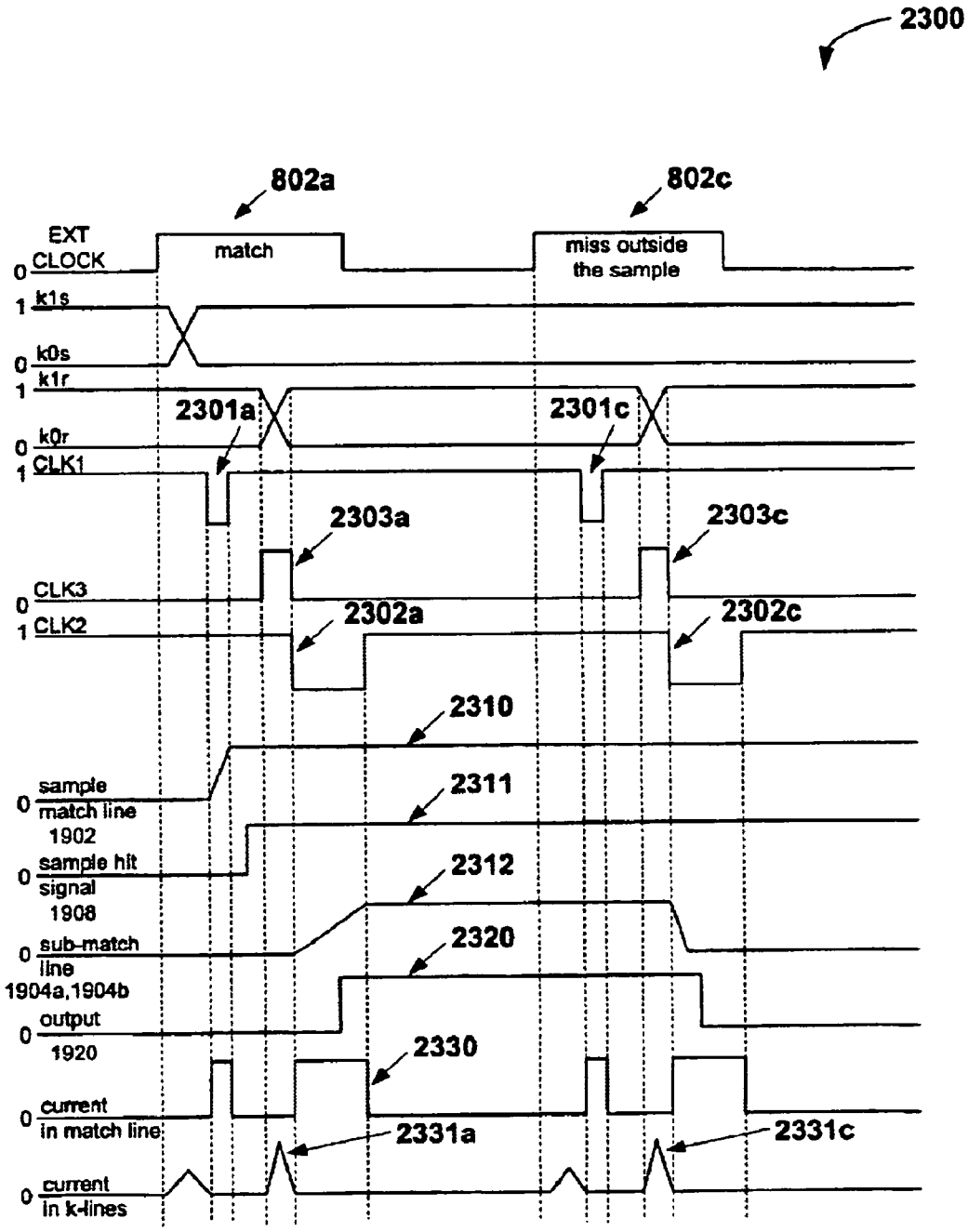
FIG. 23 is a diagram showing additional exemplary search signals for a bit pattern entry configured to save power on the compare lines during search operations, in accordance with an embodiment of the present invention.

FIG. 23 is a diagram showing exemplary search signals 2300 for a bit pattern entry configured to save power on the compare lines during search operations, in accordance with an embodiment of the present invention. FIG. 23 exemplifies two external clock cycles 802a ad 802c. In the first cycle 802a there is a match in both the sample word and in the remainder of the word of a bit pattern entry, similar to that illustrated in FIG. 22. In the second cycle 802c, there is a match in the sample word, but a "miss" occurs in the remainder of the word for the bit pattern entry.

The first external clock cycle 802a occurs as described above with reference to FIG. 22. During the second cycle 802c of the external clock the comparand is the same as during the cycle 802a on the sample local compare lines K0s and K1s. As a result, the sample match line 1902 and the sample match signal 1908 remain at logic 1. Thus, latches 2104 and 2105 become transparent and the remainder local compare lines K0r and K1r toggle. Consequently, the waveform showing the current in the k lines has a pulse 2331a in the cycle 802a and a pulse 2331c in cycle 802b.

Figure 24:
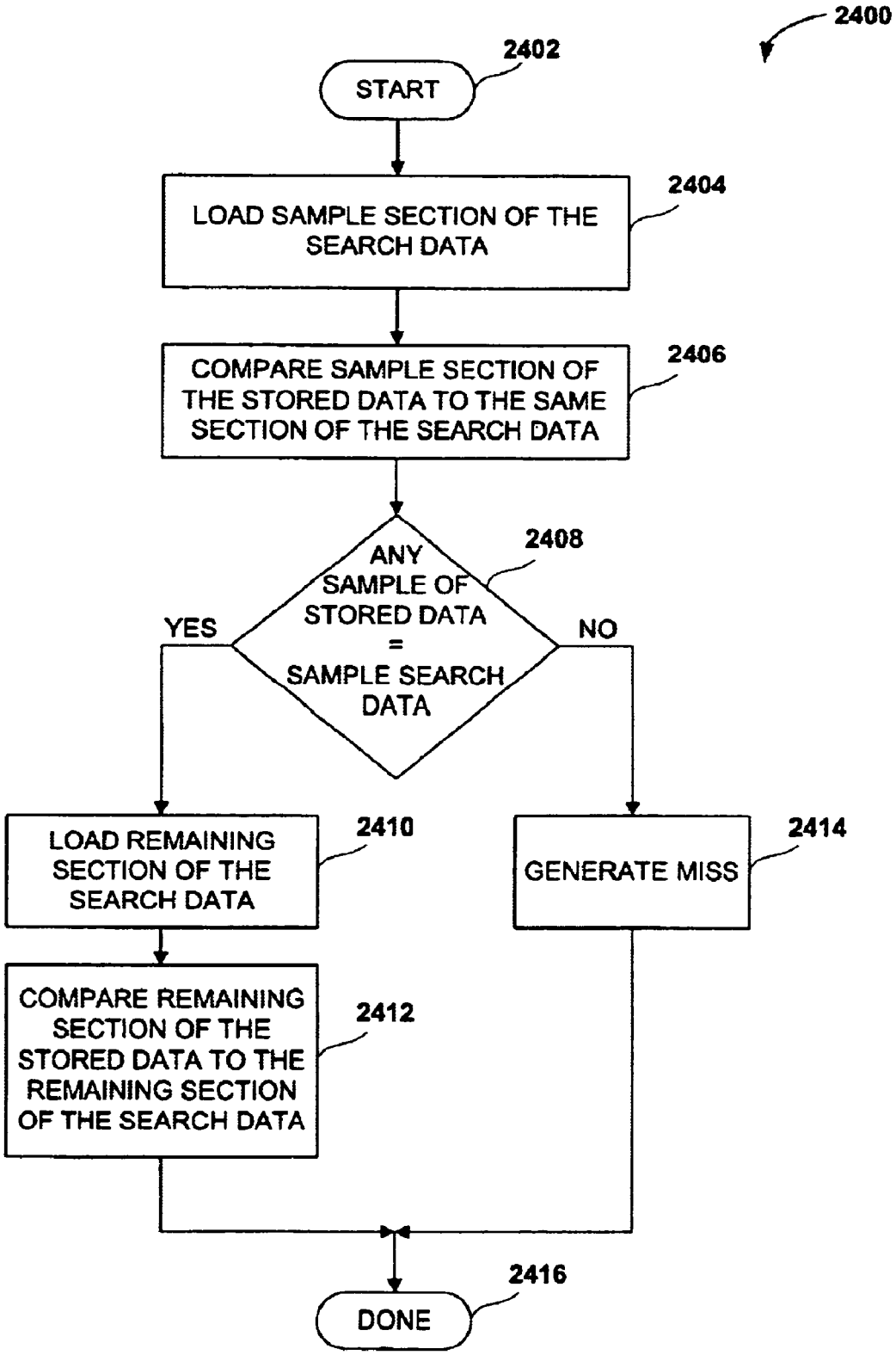
FIG. 24 is a flowchart showing a method for reducing power on the compare lines of a CAM using sample words, in accordance with an embodiment of the present invention.

FIG. 24 is a flowchart showing a method 2400 for reducing power on the compare lines of a CAM using sample words, in accordance with an embodiment of the present invention. In an initial operation 2402, preproces operations are performed. Preprocess operations can include, for example, configuring the CAM, receiving a comprand from the search port, and other preprocess operations that will be apparent to those skilled in the art after a careful reading of the present disclosure.

In operation 2404, search data is loaded onto the sample compare lines for each bit pattern entry. As described above, sample global compare lines are buffered every q rows. The outputs of the buffers generate sample local compare lines, which are utilized to search the sample words.

In operation 2406, a sample section of stored data is compared to a sample section of the search data using the sample compare lines. Generally, the bit pattern entry of the present invention includes a plurality of CAM cells coupled to a match line comprised of a sample match line, and two sub-match lines. The sub-match lines are coupled to inverters, which are coupled to a NOR gate. The output of the NOR gate is provided to a latch, which latches the output of the bit pattern entry.

During a search operation, the bit pattern entry first compares the search data with the data stored in the CAM cells coupled to the sample match line. In the following description n is the total number of CAM cells comprising the bit pattern entry. In addition, m is the total number of CAM cells coupled to the sample match line. Similarly, $(n-m)/2$ is the number of CAM cells coupled to each sub-match line. Further, m is smaller than n, and preferably, m is much smaller than n ($m \ll n$).

A decision is then made, in operation 2408, as to whether any sample section of stored data matches the sample section of the search data for the q rows grouped together. As described above, a plurality of sample match line signals from a number q rows are provided as inputs to a multiple input OR gate having q inputs. The sample match line signals are the sample search outputs from the for the sample word from a number of q bit pattern entries spread over q rows. If any sample section of stored data matches the sample section of the search data for the q rows grouped together, the method 2400 continues to operation 2410. Otherwise the method 2400 branches to operation 2414.

In operation 2410, search data is loaded onto the remainder compare lines for each bit pattern entry. The remainder global compare lines are latched every q rows. The outputs of the latches generate the remainder local compare lines, which are utilized to search the remainder of the bit pattern entry. The latches are operated based on a match group control signal, which is the output of the multiple input OR gate described in operation 2408.

In particular, the output of the multiple input OR gate generates the match group signal, which is provided as an input to an AND gate along with a third clock signal CLK3. The output of the AND gate provides a latch control signal, which is utilized to control the local compare line latches. The compare line latches are utilized to allow the data from the remainder global compare lines to propagate to the remainder local compare lines.

The remaining section of the stored data is compared to the remaining section of the search data, in operation 2412. Searches occur only on sub-match lines wherein a hit occurred on the related sample match line as described in operation 2406.

A "miss" is generated, in operation 2414, if none of the sample sections of stored data matches the sample section of the search data for the q rows grouped together. Further, if none of the sample sections of stored data matches the sample section of the search data for the q rows grouped together, the search data from the remainder global compare lines is not propagated to the remainder local compare lines. As can be appreciated, only if all sample match signal inputs to the multiple input OR gate are logic 0, does the search data from the remainder global compare lines not propagate to the remainder local compare lines.

Post process operations are performed in operation 2416. Post process operations include CAM maintenance, hit prioritizing, and other post-process operations that will be apparent to those skilled in the art. Advantageously, embodiments of the present invention reduce the amount of power required in the CAM during search operations by not allowing the remainder local compare lines to toggle if a "miss" occurs in all the sample words grouped together in q rows. Further, by properly choosing bit positions throughout the bit pattern entry, the sample portion of the bit pattern entry can be made to have a high probability of missing.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for low power searching in a content addressable memory (CAM), comprising the operations of:

comparing a sample section of stored data to a corresponding sample section of search data on a plurality of rows in the CAM;

allowing a remaining section of search data to propagate to local compare lines coupled to a remaining section of the stored data of each row if a sample section of the stored data on any row of the plurality of rows is equivalent to the corresponding sample section of the search data; and latching the local compare lines coupled to the remaining section of the stored data on each row if the sample section of the stored data is different from the corresponding sample section of the search data.

2. A method as recited in claim 1, further comprising the operation of loading the search data onto global compare lines, each global compare line spanning a width of the CAM.

3. A method as recited in claim 2, further comprising the operation of providing results of a comparison between the sample section of the stored data and the corresponding sample section of the search data for each row of the plurality of rows as [an] inputs to *a* logic gate.

4. A method as recited in claim 3, further comprising the operation of allowing search data to propagate from the global compare lines to the local compare lines if an output of the logic gate indicates a comparison result is a match.

5. A method as recited in claim 4, further comprising the operation of latching the local compare lines if the output of the logic gate indicates all the comparison results are misses.

6. A method as recited in claim 1, wherein the remaining section of the stored data is not compared to the corresponding remaining section of the search data if the sample section of the stored data is different from the corresponding section of the search data.

7. A method as recited in claim 1, wherein the sample section of the stored data is smaller than the remaining section of the stored data.

8. A method as recited in claim 7, wherein a match line coupled to the stored *data* comprises a first section and a second section, both the first section and the second section being coupled to a latch via *a* gate.

9. A method as recited in claim 8, wherein a first portion of the sample section of the stored data is coupled to the first section of the match line and a second portion of the sample section of the stored data is coupled to the second section of the match line.

10. A match line for a content addressable memory (CAM), the match line being one of a plurality of match lines forming a group of match lines, the match line comprising:

a sample match line coupled to a first set of CAM cells;

a sub-match line coupled to a second set of CAM cells, each CAM cell of the second set of CAM cells being coupled to local compare lines, the local compare lines being in electrical communication with global compare lines via a plurality of local compare line latches; and a compare line propagation control circuit coupled to the local compare line latches, wherein the compare line propagation control circuit latches the local compare lines if a sample section of search data corresponding to the first set of CAM cells is different from data stored in the first set of CAM cells for each sample match line in the group of match lines.

11. A match line as recited in claim 10, wherein the compare line propagation control circuit allows the search data to propagate from the global compare lines to the local compare lines if the sample section of search data corresponding to the first set of CAM cells is equivalent to data stored in the first set of CAM cells for any sample match line in the group of match lines.

12. A match line as recited in claim 11, wherein the compare line propagation control circuit includes a logic gate having a plurality of inputs, each input of the logic gate being in electrical communication with the sample match line of each match line in the group of match lines.

13. A match line as recited in claim 12, wherein the search data is allowed to propagate from the global compare lines to the local compare lines if an output of the logic gate indicates a match on any sample match line of the group of match lines.

14. A match line as recited in claim 13, wherein the local compare lines are latched if the output of the logic gate indicates a "miss" on all the sample match lines of the group of match lines.

15. A content addressable memory (CAM), comprising:

a group of match lines, each match line including a sample match line coupled to a first set of CAM cells, and a submatch line coupled to a second set of CAM cells, each CAM cell of the second set of CAM cells being coupled to a pair of local compare lines;

a plurality of global compare lines, each global compare lines spanning a width of the CAM, each global compare line in electrical communication with a plurality of local compare lines via a plurality of local compare line latches; and a compare line propagation control circuit coupled to the local compare line latches, wherein the compare line propagation control circuit latches the local compare lines if a sample section of search data corresponding to the first set of CAM cells is different from data stored in the first set of CAM cells for each sample match line in the group of match lines.

16. A CAM as recited in claim 15, wherein the compare line propagation control circuit allows the search data to propagate from the global compare lines to the local compare lines if the sample section of search data corresponding to the first set of CAM cells is equivalent to data stored in the first set of CAM cells for any sample match line in the group of match lines.

17. A CAM as recited in claim 16, wherein the compare line propagation control circuit includes a logic gate having a plurality of inputs, each input of the logic gate being in electrical communication with the sample match line of each match line in the group of match lines.

18. A CAM as recited in claim 16, wherein the search data is allowed to propagate from the global compare lines to the local compare lines if an output of the logic gate indicates a match on any sample match line of the group of match lines.

19. A CAM as recited in claim 18, wherein the local compare lines are latched if the output of the logic gate indicates a "miss" on all the sample match lines of the group of match lines.

*20. An apparatus, comprising:*

*means for comparing a sample section of stored data to a corresponding sample section of search data on one or more rows in a content addressable memory;*

*means for allowing a remaining section of search data to propagate to local compare lines coupled to a remaining section of the stored data of one or more rows if a sample section of the stored data on any row of the one or more rows is equivalent to the corresponding sample section of the search data; and*

*means for latching the local compare lines coupled to the remaining section of the stored data on one or more rows*

*if the sample section of the stored data is different from the corresponding sample section of the search data.*

*21. An apparatus as claimed in claim 20, further comprising means for loading the search data onto global compare lines, one or more of the global compare lines spanning a width of the content addressable memory.*

*22. An apparatus as claimed in claim 21, further comprising means for providing results of a comparison between the sample section of the stored data and a corresponding sample section of the search data for one or more of the one or more rows as an input to a logic gate.*

*23. An apparatus as claimed in claim 22, further comprising means for allowing search data to propagate from the global compare lines to the local compare lines if an output of the logic gate indicates a comparison result is a match.*

*24. An apparatus as claimed in claim 23, further comprising means for latching the local compare lines if the output of the logic gate indicates all the comparison results are misses.*

*25. An apparatus as claimed in claim 20, further comprising means for preventing comparing of the remaining section of the stored data to a corresponding remaining section of the search data if the sample section of the stored data is different from a corresponding section of the search data.*

*26. An apparatus as claimed in claim 20, wherein the sample section of the stored data is smaller than the remaining section of the stored data.*

*27. An apparatus as claimed in claim 26, further comprising a match line coupled to the stored data comprising a first section and a second section, and further comprising means for coupling the first section or the second section, or combinations thereof, to a latch via a gate.*

*28. An apparatus as claimed in claim 27, further comprising means for coupling a first portion of the sample section of the stored data to the first section of the match line, and means for coupling a second portion of the sample section of the stored data to the second section of the match line.*

*29. A method, comprising:*

*comparing a first portion of stored data to a corresponding first portion of search data on a row in a content addressable memory; and*

*providing a second portion of search data to a compare line coupled to a second portion of the stored data of the row if the first portion of the stored data is equivalent to the corresponding first portion of the search data.*

*30. The method of claim 29, wherein the first portion of stored data is compared to a corresponding first portion of search data on a plurality of rows of the content addressable memory, wherein the second portion of search data is provided to compare lines coupled to the second portion of the stored data of each of the plurality of rows if the first portion of the stored data on any row of the plurality of rows is equivalent to the corresponding first potion of the search data.*

*31. The method of claim 30, further comprising latching the compare line coupled to the second portion of the stored data if the first portion of the stored data is different from the corresponding first portion of the search data.*

* * * * *

UNITED STATES PATENT AND TRADEMARK OFFICE

CERTIFICATE OF CORRECTION

PATENT NO. : RE43,359 E
APPLICATION NO. : 11/503542
DATED : May 8, 2012
INVENTOR(S) : Avramescu et al.

It is certified that error appears in the above-identified patent and that said Letters Patent is hereby corrected as shown below:

In Fig. 1C, Drawing Sheet 3 of 28, delete Tag "130" and insert Tag -- 150 --, therefor.

In Column 5, Line 44, delete "is" and insert -- is a --, therefor.

In Column 5, Line 50, delete "is" and insert -- is a --, therefor.

In Column 7, Line 52, delete "docs" and insert -- does --, therefor.

In Column 8, Line 33, delete "K0. if" and insert -- K0. If --, therefor.

In Column 13, Line 42, delete "is" and insert -- is a --, therefor.

In Column 14, Line 42, delete "march" and insert -- match --, therefor.

In Column 15, Line 25, delete "is" and insert -- is a --, therefor.

In Column 17, Line 57, delete "(CLK1," and insert -- /CLK1, --, therefor.

In Column 18, Line 62, delete "lock" and insert -- clock --, therefor.

In Column 23, Line 49, delete "Waveformns" and insert -- Waveforms --, therefor.

In Column 23, Line 56, delete "$V_{DD}$," and insert -- $V_{dd}$, --, therefor.

In Column 25, Line 42, delete "preproces" and insert -- preprocess --, therefor.

In Column 25, Line 44, delete "comprand" and insert -- comparand --, therefor.

Signed and Sealed this
Fifth Day of February, 2013

Teresa Stanek Rea
*Acting Director of the United States Patent and Trademark Office*